United States Patent
Nakanishi et al.

(10) Patent No.: US 6,278,303 B1
(45) Date of Patent: Aug. 21, 2001

(54) SEMICONDUCTOR DEVICE THAT CAN HAVE STANDBY CURRENT REDUCED BY CEASING SUPPLY OF CLOCK SIGNAL, AND THAT CAN MAINTAIN STATUS OF INTERNAL CIRCUIT

(75) Inventors: Jingo Nakanishi; Hiroshi Makino; Tsutomu Yoshimura, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/437,739

(22) Filed: Nov. 10, 1999

(30) Foreign Application Priority Data

May 31, 1999 (JP) .................................................. 11-151913

(51) Int. Cl.[7] ........................................................ H03L 7/06
(52) U.S. Cl. .......................... 327/156; 327/142; 331/1 A; 375/376
(58) Field of Search ................................... 327/156, 158, 327/159, 142; 331/1 A, 25; 375/158, 376, 373

(56) References Cited

U.S. PATENT DOCUMENTS

| | | | |
|---|---|---|---|
| 4,025,720 | * | 5/1977 | Pachynski, Jr. ........................ 375/158 |
| 5,339,278 | * | 8/1994 | Irwin et al. ............................. 331/16 |
| 5,483,204 | * | 1/1996 | Tanoi ..................................... 327/156 |
| 5,703,537 | * | 12/1997 | Bland et al. ........................... 331/1 A |
| 6,101,137 | * | 8/2000 | Roh ....................................... 327/156 |

FOREIGN PATENT DOCUMENTS 7-202687   8/1995   (JP) .

OTHER PUBLICATIONS

"Phase Locked Loop Clock Techniques", Weste et al., Principles of CMOS VLSI Design, 1993, pp. 334–335.

* cited by examiner

*Primary Examiner*—Terry D. Cunningham
*Assistant Examiner*—An T. Luu
(74) *Attorney, Agent, or Firm*—McDermott, Will & Emery

(57) ABSTRACT

A clock circuit is provided including a clock supply circuit that can cease clock supply according to a control signal, a PLL circuit maintaining clock synchronization, and a dummy circuit. Synchronization of the internal clock signal is maintained by the PLL circuit and the dummy circuit even in a standby state. In returning to an active state from a standby state, an unstable clock signal arising from unstable locking of the PLL circuit will not be applied to the internal circuit. Therefore, the information in the latch circuit in the internal circuit can be maintained.

17 Claims, 19 Drawing Sheets

SEMICONDUCTOR DEVICE THAT CAN HAVE STANDBY CURRENT REDUCED BY CEASING SUPPLY OF CLOCK SIGNAL, AND THAT CAN MAINTAIN STATUS OF INTERNAL CIRCUIT

BACKGROUND OF THE INVENTION

1. Field of the Invention

The present invention relates to semiconductor devices, and more particularly, to a semiconductor device incorporating a synchronizing clock generation circuit generating an internal dock signal in synchronization with an externally applied clock signal.

2. Description of the Background Art

Some conventional semiconductor devices incorporate a circuit that generates an internal clock signal in synchronization with an externally applied clock signal, for example, a PLL (Phase Locked Loop) circuit.

FIG. 17 schematically shows a structure of a conventional semiconductor device 500.

Referring to FIG. 17, semiconductor device 500 includes a PLL circuit 554 receiving clock signals REF.CLK and FB.CLK to generate a clock signal ICLK, a clock driver 560 amplifying and providing a clock signal CLK, and an internal circuit 562 receiving the output clock of clock driver 560 to carry out a predetermined operation.

Internal circuit 562 includes a latch circuit 566 having a plurality of flipflop circuits receiving a clock signal for operation, and a combination circuit 564 which is an internal circuit other than the latch circuit.

In such large scale integrated circuits (LSI), a latch circuit is connected including a plurality of flipflop circuits and the like at the output of the clock driver.

The operation of PLL circuit 554 will be described briefly hereinafter. PLL circuit 554 outputs a clock signal ICLK so that clock signal FB.CLK that is fed back is in synchronization and in equal phase with externally applied clock signal REF.CLK. As a result, clock signal ICLK in phase with clock signal REF.CLK is applied to internal latch circuit 566.

By this structure, synchronization can be established between internal and external clock signals of the LSI.

In general, the LSI has a great amount of power consumed in the circuitry that distributes the clock signal. A circuit that distributes a clock signal includes, for example, a clock driver to drive a clock interconnection of great interconnection capacitance and load capacitance.

In the LSI used in portable equipment, a period in which there is no input signal to be processed, i.e. the standby period, occupies the major portion. It is often not necessary to operate the main function of the LSI during the standby period. Power consumption can be reduced significantly if the clock can be suppressed during the standby period.

Conventional problems set forth in the following are noted when the circuit operation is suppressed temporarily for the purpose of reducing power consumption.

In the circuit shown in FIG. 17, the possible method to cease the clock signal is to provide a switch between PLL circuit 554 and clock driver 564 to suppress clock generation of PLL circuit 554, whereby the operation of clock driver 560 is suppressed. This method is disadvantageous in that, when generation of the clock signal is recommended and applied to internal circuit 562, there will be a period of time in which synchronization cannot be established between clock signal ICLK generated from PLL circuit 554 and clock signal REF.CLK.

There is a possibility that the data stored in latch circuit 566 will be damaged by the unstable clock signal applied to internal circuit 562 until synchronization of the clock signal is established, resulting in erroneous operation.

Thus, there was a problem that the data in the internal latch circuit will be damaged due to the period of time required for synchronization of the PLL at the restart of the clock in the conventional method. To this end, the invention disclosed in Japanese Patent Laying-Open No. 7-202687 was conceived.

FIG. 18 shows a circuit diagram of a clock circuit 400 disclosed in Japanese Patent Laying-Open No. 7-202687.

Referring to FIG. 18, clock circuit 400 includes a phase difference voltage conversion circuit PVC receiving an external clock signal CLK and a feed back clock signal FCK, a voltage control oscillation circuit VCO under control of the output voltage of phase difference voltage conversion circuit PVC to output a common clock signal, a clock supply circuit CS receiving the output of voltage control oscillation circuit VCO to supply a local clock signal LCK to a logic circuit LD, a dummy clock circuit DCS receiving the output of voltage control oscillation circuit VCO to output a dummy clock signal DCL, and a select circuit SEL receiving a control signal R according to an operation mode MODE to apply either local clock signal CLK or dummy clock signal DCL to phase difference voltage conversion circuit PVC as feed back clock signal FCK.

However, the circuit shown in FIG. 18 was disadvantageous in that phase difference occurs between external clock signal CLK and local clock LCK by select circuit SEL.

FIG. 19 is an operation waveform diagram to describe the operation of clock signal 400 of FIG. 18.

At time t0–t1, the operation mode corresponds to an active state. Synchronization is established between external clock signal CLK and local clock signal LCK.

At time t1–t2, the operation mode changes from the active state to the standby state. In response, local clock signal LCK is fixed at an L level (logical low) during the period of time t2–t3.

At time t3–t4, the operation mode changes again from the standby state to the active state. In response, local clock LCK is in synchronization with external clock signal CLK at time t4 and et seq.

As to the locking state of the external clock signal and the local clock signal in the vicinity of time to, a phase comparator PD of phase difference voltage conversion circuit PVC is at a steady state when input signals CK1 and CK2 are in phase. When clock circuit 400 is at a steady state, feed back clock signal FCK is in phase with external clock signal CLK.

Feed back clock signal FCK corresponds to the output of local clock signal LCK supplied to logic circuit LD via select circuit SEL. Therefore, local clock signal LCK leads external clock signal CLK in phase by an offset time TOF corresponding to the delay time by select circuit SEL.

SUMMARY OF THE INVENTION

An object of the present invention is to provide a semiconductor device including a clock supply circuit absent of phase difference between an external clock signal and a clock signal applied in an internal circuit in an active state, and that can return from a standby state without damaging data stored in the latch circuit while suppressing power consumption by ceasing the clock signal in a standby state.

According to an aspect of the present invention, a semiconductor device includes a synchronizing clock generation circuit, a clock supply circuit, a clock transmission unit, and an internal circuit.

The synchronizing clock generation circuit generates a source clock signal in synchronization with an external clock signal. The synchronizing clock generation circuit includes a clock delay circuit delaying the source clock signal to output a feed back clock signal, and a signal generation circuit generating a source clock signal according to the phase difference between an external clock signal and a feed back clock signal when in an active mode and a standby mode of the operation mode.

The clock supply circuit receives the source clock signal to output an intermediate clock signal in an active mode and to render the output inactive in a standby mode.

The clock transmission unit transmits the intermediate clock signal. The internal circuit receives an internal clock signal corresponding to the intermediate clock signal from the clock transmission unit to carry out a predetermined operation. The internal circuit includes a data retain circuit receiving and retaining data according to the internal clock signal.

According to another aspect of the present invention, a semiconductor device includes a synchronizing clock generation circuit, a clock supply circuit, a clock transmission unit, an internal circuit, a main power supply line, and a sub power supply line.

The synchronizing clock generation circuit generates a source clock signal in synchronization with an external clock signal. The synchronizing clock generation circuit includes a clock delay circuit delaying the source clock signal to output a feed back clock signal, and a signal generation circuit generating a source clock signal according to phase difference between the external clock signal and the feed back clock signal.

The clock supply circuit receives the source clock signal to output an intermediate clock signal when in the active mode, and renders the output inactive when in the standby mode.

The clock transmission unit transmits the intermediate clock signal. The internal circuit receives an internal clock signal corresponding to the intermediate clock signal from the clock transmission unit to carry out a predetermined operation. The internal circuit includes a data retain circuit that receives and retains data according to the internal clock signal. The main power supply line supplies a first operating current to the data retain circuit. The sub power supply line provided independent of the main power supply line supplies a second operating current to the signal generation circuit.

According to a further aspect of the present invention, a semiconductor device includes a synchronizing clock generation circuit, a clock supply circuit, a clock transmission unit, and an internal circuit.

The synchronizing clock generation circuit generates a source clock signal in synchronization with an external clock signal. The synchronizing clock generation circuit includes a clock delay circuit delaying the source clock signal to output a feed back clock signal, and a signal generation circuit generating a source clock signal according to phase difference between the external clock signal and the feed back clock signal.

The clock supply circuit receives the source clock signal to output an intermediate clock signal when in an active mode, and to render the output inactive when in a standby mode. The clock supply circuit includes an MOS transistor having the absolute value of the phase difference between a back gate and a source set to a first value in the active mode, and to a second value greater than the first value when in the standby mode. The clock transmission unit transmits the intermediate clock signal. The internal circuit receives an internal clock signal corresponding to the intermediate clock signal from the clock transmission unit to carry out a predetermined operation. The internal circuit includes a data retain circuit that receives and retains data according to the internal clock signal.

According to still another aspect of the present invention, a semiconductor device includes a synchronizing clock generation circuit, a clock supply circuit, a clock transmission unit, and an internal circuit.

The synchronizing clock generation circuit generates a source clock signal in synchronization with an external clock signal. The synchronizing clock generation circuit includes a clock delay circuit delaying the source clock signal to output a feed back clock signal, and a signal generation circuit generating a source clock signal according to phase difference between the external clock signal and the feed back clock signal. The clock supply circuit receives the source clock signal to output an intermediate clock signal when in an active mode, and to render the output inactive when in a standby mode. The clock transmission unit transmits the intermediate clock signal. The internal circuit receives an internal clock signal corresponding to the intermediate clock signal from the clock transmission unit to carry out a predetermined operation. The internal circuit includes an MOS transistor having the absolute value of the potential difference between a back gate and source set to a first value when in the active mode, and to a second value greater than the first value when in the standby mode.

According to a still further aspect of the present invention, a semiconductor device includes a synchronizing clock generation circuit, a clock supply circuit, and an internal circuit.

The synchronizing clock generation circuit generates a source clock signal in synchronization with an external clock signal. The synchronizing clock generation circuit includes a clock delay circuit delaying an input signal, a switch circuit applying the source clock signal as the input signal to the clock delay circuit and to provide the output of the clock delay circuit as a feed back clock signal when in an active operation mode, and to output the source clock signal directly as the feed back clock signal, and to cease supply of the source clock signal to the clock delay circuit when in a standby mode, and a signal generation circuit generating a source clock signal according to phase difference between the external clock signal and the feed back clock signal.

The clock supply circuit receives a source clock signal to output an intermediate clock signal when in an active mode and to render the output inactive when in a standby mode. The clock transmission unit transmits the intermediate clock signal. The internal circuit receives an internal clock signal corresponding to the intermediate clock signal from the clock transmission unit to carry out a predetermined operation. The internal circuit includes a data retain circuit that receives and retains data according to the internal clock signal.

The main advantage of the present invention is that power consumption can be suppressed significantly in a standby state since the clock driver is set to a cease state while maintaining clock synchronization by a dummy circuit that is lower in power consumption than the clock driver. Since an unstable clock signal will not be supplied to the latch circuit when the semiconductor device returns to the operating state from the standby state, no erroneous operation occurs. Furthermore, the phase difference between the clock signal used in the internal latch and the externally applied clock signal can be reduced.

Another advantage of the present invention is that power consumption during the standby state can be reduced by dividing the power supply line and suppressing unnecessary current supply.

A further advantage of the present invention is that power consumption can be further reduced since leakage current can be reduced in a standby state.

Still another advantage of the present invention is that power consumption in the standby state can be reduced, and that, when returning from the standby state, the time required for complete locking of the synchronizing clock generation circuit is reduced to allow rapid return from the standby state to the normal operating state.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
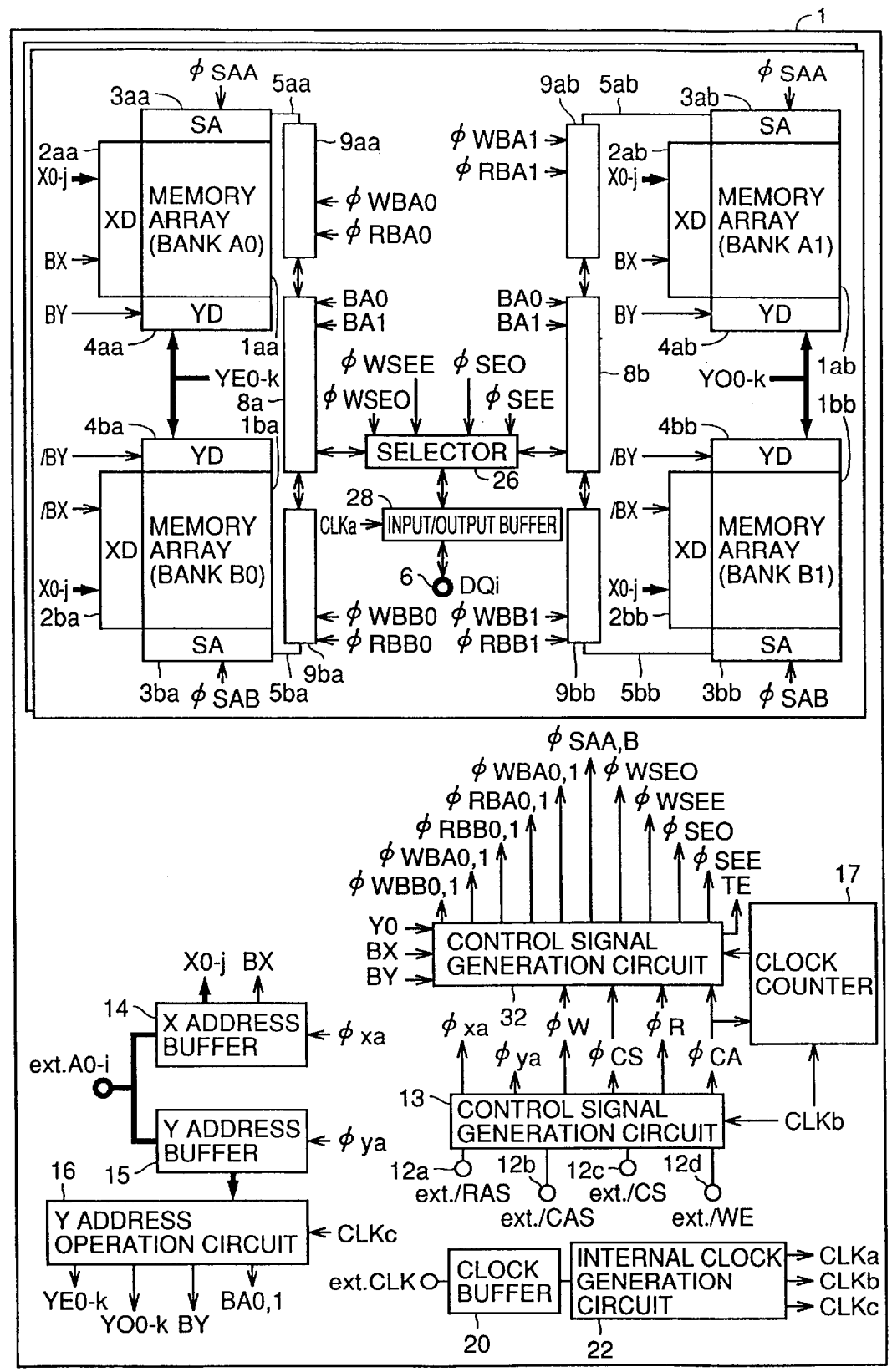
FIG. 1 is a block diagram showing the structure of a synchronous semiconductor memory device 1 exemplary of a semiconductor device of the present invention.

Embodiments of the present invention will be described in detail hereinafter with reference to the drawings. In the drawings, the same reference characters denote the same or corresponding components.

FIG. 1 is a block diagram showing a structure of a synchronous semiconductor memory device 100 which is an example of the semiconductor device of the present invention.

In the synchronous semiconductor memory device, the circuit that generates the internal clock is extremely important since operation is carried out on the basis of an internal clock equal in phase with the external clock.

In FIG. 1, the structure of the portion associated with data transfer of one bit and the peripheral circuit thereof is shown. The section associated with data transfer is provided corresponding to respective data input/output terminals.

Referring to FIG. 1, a synchronous semiconductor memory device 1 includes memory arrays 1*aa*, 1*ab*, 1*ba* and 1*bb*. Each memory array includes a plurality of memory cells arranged in a matrix.

Synchronous semiconductor memory device 1 includes two banks A and B. Memory arrays 1*aa* and 1*ab* form bank A. Memory arrays 1*ba* and 1*bb* form bank B.

In respective banks A and B, memory array 1*aa* forms a sub bank A0, memory array 1*ab* forms a sub bank A1, memory array 1*ba* forms a sub bank B0 and memory array 1*bb* forms a sub bank B1.

Synchronous semiconductor memory device 1 functions as a 2-bank SDRAM. Banks A and B can be driven active/inactive independent of each other. The bank is specified by a bank address applied at the same time with each command.

For memory array 1*aa* are provided an X decoder group 2*aa* rendered active by a bank address signal BX to decode a row address signal X0-j to drive the addressed row in memory array 1*aa* to a selected state, a sense amplifier group 3*aa* rendered active by a sense amplifier activation signal φSAA to sense, amplify, and latch data of the memory cell connected to the selected row in memory array 1*aa*, and an Y decoder group 4*aa* rendered active by a bank address signal BY to decode a column address signal YE0-k to select an addressed column in memory array 1*aa*.

The memory cells on the column selected by Y decoder group 4*aa* are coupled to an internal data bus 5*aa*. Bank address signal BX is applied at the same time with an active command or a precharge command that designates return to a precharged state. Bank address signal BY is applied at the same time with a read command or a write command.

Similarly, an X decoder group 2*ab*, a sense amplifier group 3*ab*, and a Y decoder group 4*ab* are provided with respect to memory array 1*ab*.

The memory cells on the column selected by Y decoder group 4*ab* are coupled to an internal data bus 5*ab*.

Similarly, an X decoder group 2*ba* rendered active by a bank address signal /BX, a sense amplifier group 3*ba* rendered active by a sense amplifier activation signal φSAB, and an Y decoder group 4*ba* rendered active by a bank address signal /BY are provided for memory array 1*ba*.

The memory cells on the column selected by Y decoder 4*ba* are coupled to an internal data bus 5*ba*.

Similarly, an X decoder group 2bb, a sense amplifier group 3bb, and a Y decoder group 4bb are provided for a memory array 1bb.

The memory cells on the column selected by Y decoder group 4bb are coupled to an internal data bus 5bb.

The X decoder group, the sense amplifier group, and the Y decoder group are termed accordingly since the X decoder group includes an X decoder arranged corresponding to each row, the sense amplifier group includes a sense amplifier provided corresponding to each column of a corresponding memory array, and the Y decoder group includes an Y decoder provided corresponding to each column.

In memory arrays 1aa and 1ab, a memory cell select operation is carried out simultaneously according to bank address signals BX and BY.

In memory arrays 1ba and 1bb, a select operation is effected simultaneously according to bank address signals /BX and /BY.

A write driver & preamplifier 9aa is provided to read out data from memory array 1aa. Write driver & preamplifier 9aa responds to activation of a register activation signal φRBA0 to receive, amplify, and latch the data from memory array 1aa read on internal data bus 5aa by sense amplifier group 3aa. Write driver & preamplifier 9aa receives and latches the data applied from a bank selector 8a that will be described afterwards according to activation of a register activation signal φWBA0 and provides the latched data to internal data bus 5aa in order to write data into memory array 1aa.

In a similar manner, write driver & preamplifiers 9ab, 9ba, and 9bb are provided for memory arrays 1ab, 1ba and 1bb, respectively.

A bank selector 8a is provided for write driver & preamplifiers 9aa and 9ba. Bank selector 8a selects either data signal output from write driver & preamplifiers 9aa and 9ba according to data select signals BA0 and BA1 to output the selected data signal.

A bank selector 8b is provided for write driver and preamplifiers 9ab and 9bb. Bank selector 8b selects and outputs either data signal output from write driver & preamplifiers 9ab and 9bb according to data select signals BA0 and BA1 to output the selected data signal.

A selector 26 to select either output from bank selectors 8a and 8b according to select signals φSE0 and φSEE in reading out data, an input/output buffer 28 receiving and amplifying the output of selector 26, and a data input/output terminal 6 for providing outside the output signal of input/output buffer 28 are provided with respect to bank selectors 8a and 8b.

In data writing, selector 26 responds to write select signals φWSEE and φWSEO to provide the data applied in synchronization with an external clock signal CLKa via input/output buffer 28 to bank selector 8a or 8b.

Synchronous semiconductor memory device 1 further includes a control signal generation circuit 13 receiving external control signals ext./RAS, ext./CAS, ext./CS and ext./WE applied at input terminals 12a, 12b, 12c and 12d in synchronization with a clock signal CLKb, and determining the state to generate internal control signals φxa, φya, φW, φCS, φR and φCA.

Signal ext./CS is a chip select signal. Synchronous semiconductor memory device 1 receives or provides data when chip select signal ext./CS is at an active state.

Signal φxa is rendered active when an active command is applied to designate input of a row address signal. Signal φya is rendered active when a read command or write command is applied to designate input of a column address signal. Signal φW is rendered active when a write command is applied to designate data writing. Signal φR is rendered active when an active command is applied to activate the circuit of the portion associated with row selection. Signal φCA is rendered active when a read command or write command is applied to activate the circuit of the portion associated with column selection and data output (column related circuitry).

Synchronous semiconductor memory device 1 further includes an X address buffer 14 receiving an external address signal ext.A0-i in response to activation of row address input designating signal φxa to generate an internal row address signal X0-j and bank address signal BX, an Y address buffer 15 rendered active when column address input designating signal φya is active to receive external address signal ext.A0-i to generate an internal column address signal, and a Y address operation circuit 16 altering the address at a predetermined sequence in synchronization with a clock signal CLKc with the internal column address signal applied from Y address buffer 15 as the head address to generate an even-number column address signal YE0-k and an odd-number column address signal YO0-k and bank address signals BY, BA0, and BA1.

Y address operation circuit 16 includes a burst address counter to alter the column address signal for every two clock cycles.

Synchronous semiconductor memory device 1 further includes a clock counter 17 counting an internal clock signal CLKb according to activation of a column related activation signal φCA to generate a count up signal at a predetermined timing according to the count value, and control signal generation circuit 32 receiving the count up signal from clock counter 17, bank address signals BX and BY, and the least significant bit Y0 of the column address signal to generate various internal control signals φRBB0, φRBB1, φRBA0, φRBA1, φSAA, φSAB, φSEO, φSEE, φWBB0, φWBB1, φWBA0, φWBA1, φWSEO, φWSEE.

The control signal for the specified bank is rendered active according to bank address signals BX and BY. Least significant column address signal bit Y0 is used to indicate which of the two memory arrays in one bank is to be accessed.

Clock counter 17 includes a counter to count the CAS latency and the burst length to generate a count up signal at a predetermined timing according to the specified operation mode.

Clock signals CLKa, CLKb, CLKc are generated at internal clock generation circuit 22 according to an external clock signal ext.CLK input/output via clock buffer 20.

The synchronous semiconductor memory device generally operates according to an internal clock signal in phase with an externally applied clock signal. If the external clock signal is directly used, the speed of the data transfer will be limited since there is a time delay before the signal is transmitted to the internal circuit. Therefore, internal clock generation circuit 22 that generates an internal clock compensated for the delay time plays an important role.

Synchronous semiconductor memory device 1 is only an example of a semiconductor device incorporating an internal clock generation circuit in synchronization with an external clock signal. Therefore, the semiconductor device of the present invention is not limited to a semiconductor memory device.

First Embodiment

Figure 2:
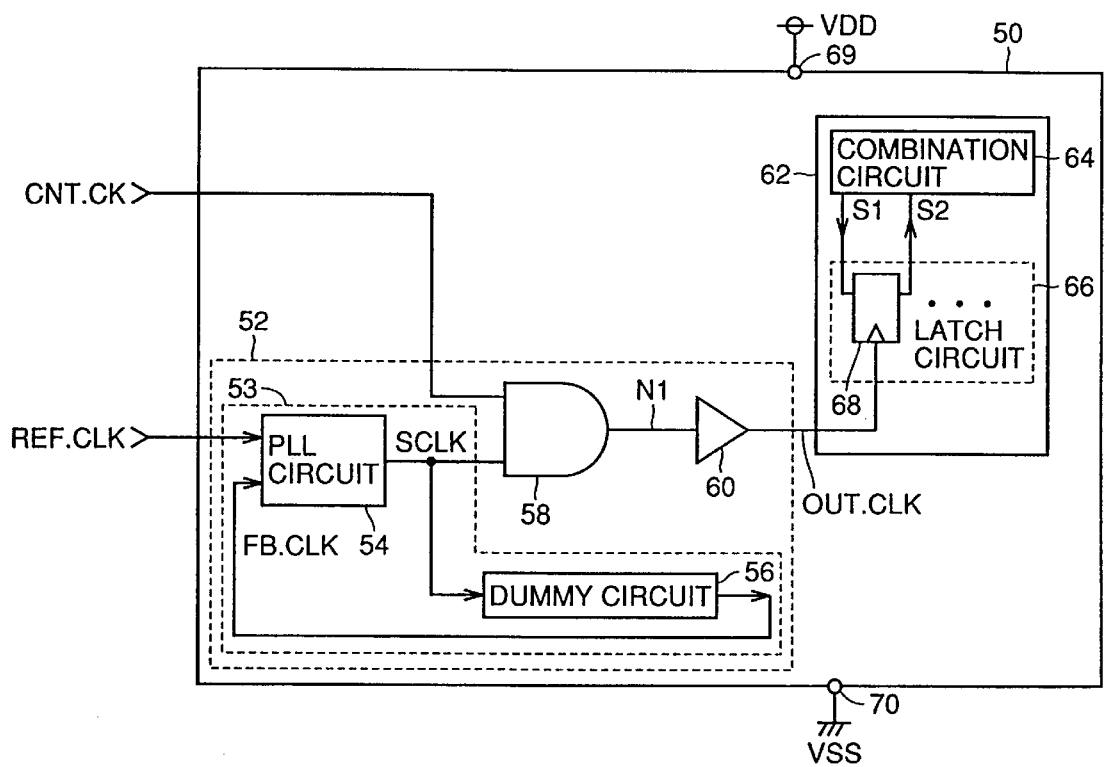
FIG. 2 is a circuit diagram showing the structure of a semiconductor device 50 according to a first embodiment of the present invention.

A semiconductor device 50 according to a first embodiment of the present invention is shown by the circuit diagram of FIG. 2. In FIG. 2, the example of the semiconductor device of FIG. 1 is represented in a more simple form.

Referring to FIG. 2, semiconductor device 50 includes a terminal 69 to which an external power supply potential VDD is applied, a terminal 70 to which an internal ground potential VSS is applied, a clock circuit 52 receiving an externally applied clock signal REF.CLK to generate a clock and providing a clock signal OUT.CLK according to control signal CNT.CK, and an internal circuit 62 receiving clock signal OUT.CLK to carry out a predetermined operation. Clock circuit 52 corresponds to internal clock generation circuit 22 of FIG. 1.

Clock circuit 52 includes a signal generation circuit 53 generating a source clock signal SCLK from clock signal REF.CLK, a clock supply circuit 58 providing source clock signal SCLK to a node N1 when control signal CNT.CK is active, and to fix node N1 to the L level when control signal CNT.CK is inactive, and a clock driver 60 connected to the input of node N1 to output clock signal OUT.CLK.

Signal generation circuit 53 includes a PLL circuit 54 receiving clock signal REF.CLK and feed back clock signal FB.CLK to output source clock signal SCLK, and a dummy circuit 56 delaying source clock signal SCLK by a predetermined time to output feed back clock signal FB.CLK.

Internal circuit 62 includes a latch circuit 66 receiving clock signal OUT.CLK to carry out the data input and retain operation. Latch circuit 66 includes a plurality of flipflops 68 receiving clock signal OUT.CLK at the clock input node to input a signal S1 as the data to output a signal S2 as the output signal.

Internal circuit 62 includes a combination circuit 64 in addition to latch circuit 66. Combination circuit 64 provides signal S1 to latch circuit 66 as the data to be retained, and receives signal S2 which is the data retained in latch circuit 66, and carries out a predetermined operation.

Figure 3:
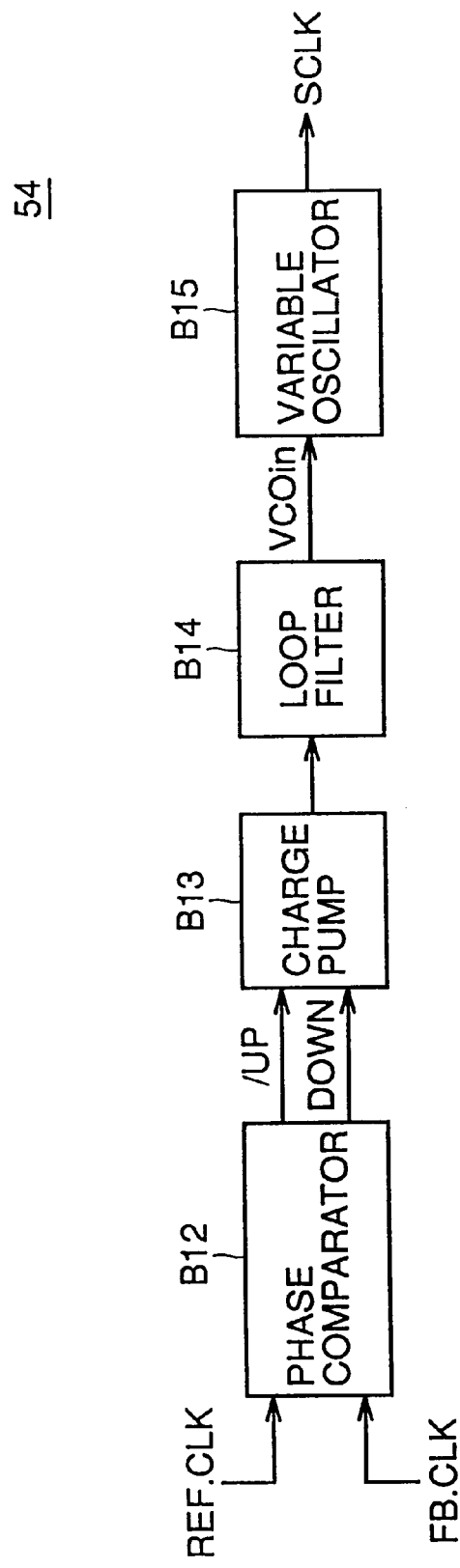
FIG. 3 is a block diagram showing a structure of a PLL circuit 54 of FIG. 2.

FIG. 3 is a block diagram showing a structure of PLL circuit 54 of FIG. 2.

Referring to FIG. 3, PLL circuit 54 includes a phase comparator B12 comparing the phase of clock signal REF.CLK with the phase of feed back dock signal FB.CLK to output signals/UP and DOWN, a charge pump B13 receiving the output of phase comparator B12, a loop filter B14 receiving the output of charge pump B13 to output a control voltage VCOin, and a variable oscillator B15 providing a source clock signal SCLK according to control voltage VCOin.

Figure 4:
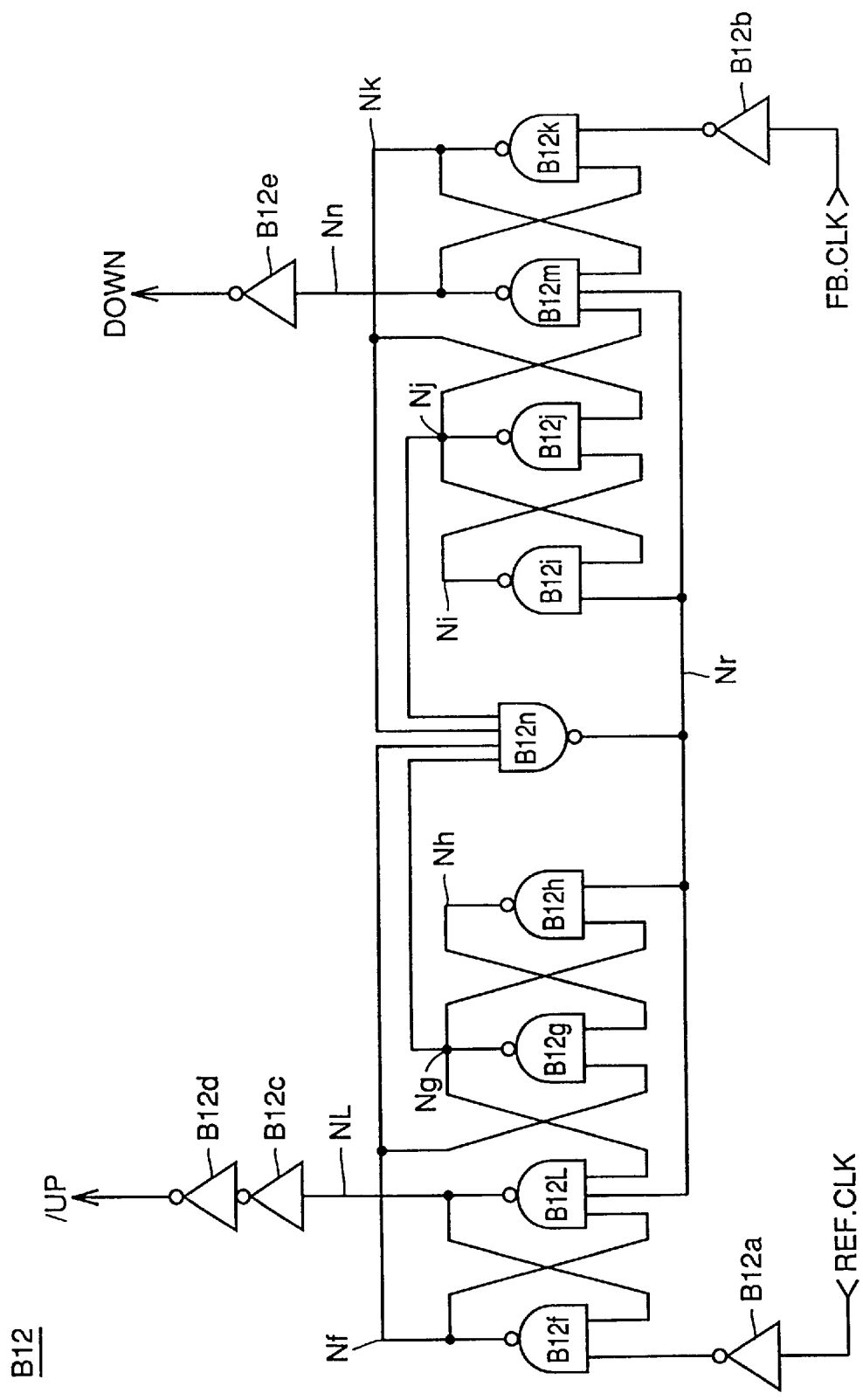
FIG. 4 is a circuit diagram showing a structure of a phase comparator B12 of FIG. 3.

Referring to FIG. 4, phase comparator B12 includes an inverter B12a receiving and inverting clock signal REF.CLK, a NAND circuit B12f receiving the output of inverter B12a and the potential of a node NL, and having its output connected to a node Nf, a NAND circuit B12L having its input connected to nodes Nf, Nr, and Ng, and having its output connected to node NL, a NAND circuit B12g having its input connected to nodes Nf and Nh, and its output connected to node Ng, a NAND circuit B12h having its input connected to nodes Ng and Nr, and its output connected to node Nh, and inverters B12c and B12d connected in series, having its input connected to node NL and providing control signal /UP.

Phase comparator B12 further includes an inverter B12b receiving feed back clock signal FB.CLK, a NAND circuit B12k receiving the output of inverter B12b and the potential of node Nn, and having its output connected to node Nk, a NAND circuit B12m having its input connected to nodes Nj, Nr and Nk, and its output connected to node Nn, a NAND circuit B12j having its input connected to nodes Ni and Nk, and its output connected to node Nj, a NAND circuit B12i having its input connected to nodes Nr and Nj, and its output connected to node Ni, a NAND circuit B12n having its input connected to nodes Ng, Nf, Nk and Nj, and its output connected to node Nr, and an inverter B12e having its input connected to node Nn to output control signal DOWN.

Figure 5:
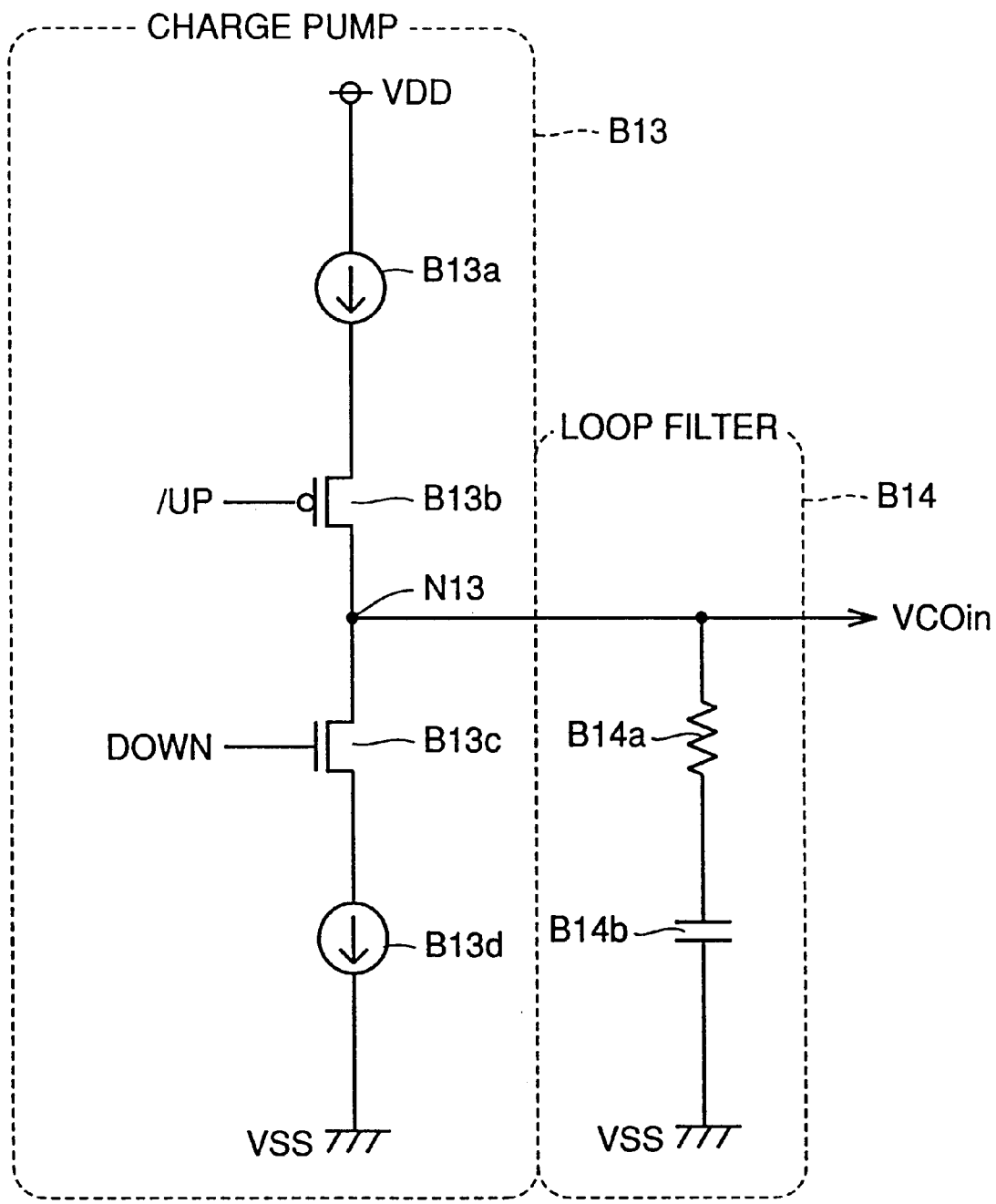
FIG. 5 is a circuit diagram showing a structure of a charge pump B13 and loop filter B14 of FIG. 3.

FIG. 5 is a circuit diagram showing a structure of charge pump B13 and loop filter B14 of FIG. 3.

Referring to FIG. 5, charge pump B13 includes a constant current source B13a, a P channel transistor B13b, an N channel transistor B13c, and a constant current source B13d connected in series between a power supply node to which power supply potential VDD is applied and the ground node.

The gate of P channel transistor B13b receives control signal /UP. The gate of N channel transistor B13c receives control signal DOWN. Connection node N13 between P channel transistor B13b and N channel transistor B13c is the output node of charge pump B13.

Loop filter B14 includes a register B13a and a capacitor B14b connected in series between an output node N13 of charge pump B13 and the ground node.

Figure 6:
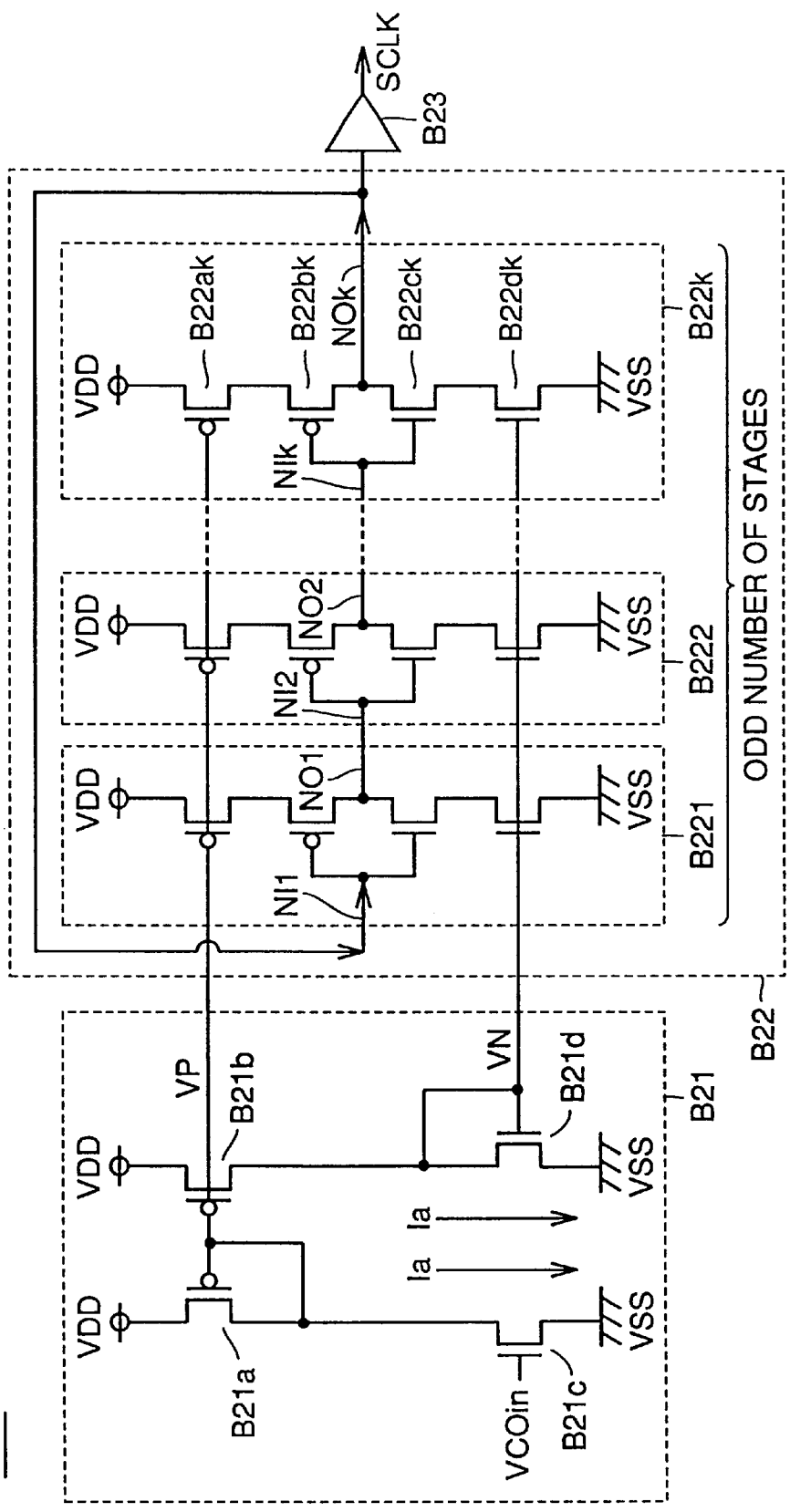
FIG. 6 is a circuit diagram showing a structure of a variable oscillator B15 of FIG. 3.

Referring to FIG. 6, variable oscillator B15 includes a control potential generation circuit B21 receiving control voltage VCOin to output potentials VP and VN, an oscillator B22 oscillating at a frequency according to a control potential VP and a control potential VN, and a buffer circuit B23 receiving the output of oscillator B22 to output source clock signal SCLK.

Control potential generation circuit B21 includes an N channel transistor B21c receiving a control voltage VCOin at its gate and having its source coupled to the ground potential, a P channel transistor B21a having its gate and drain coupled to the drain of N channel transistor B21c and having its source connected to power supply potential VDD, a P channel transistor B21b receiving the potential of the drain of N channel transistor B21c at its gate, and having its source coupled to power supply potential VDD, and an N channel transistor B21d having its drain and gate connected to P channel transistor B21b, and having its source coupled to the ground potential.

The potential at the drain of N channel transistor B21c corresponds to control potential VP. The potential at the drain of P channel transistor B21b corresponds to control potential VN.

Oscillator B22 includes a plurality of odd number of stages of inverters B221–B22k connected in series. The output of inverter B22k is fed back to the input of inverter B221.

The output of inverter B22k is connected to the input of the buffer circuit B23.

Inverter B22k (k is an natural number) is an inverter that can control the delay time. Inverter B22k includes a P channel transistor B22ak receiving control potential VP at its gate to limit the current from the power supply node to which power supply potential VDD is applied, an N channel transistor B22dk receiving control potential VN at its gate to limit the current flowing towards the ground node, and a P channel transistor B22bk and an N channel transistor B22ck connected in series between the drain of P channel transistor B22ak and the drain of N channel transistor B22dk.

The gate of P channel transistor B22bk is connected to the gate of N channel transistor B22ck, functioning as the input node of inverter B22k. The drain of P channel transistor B22bk corresponds to the output node of inverter B22k.

Figure 7:
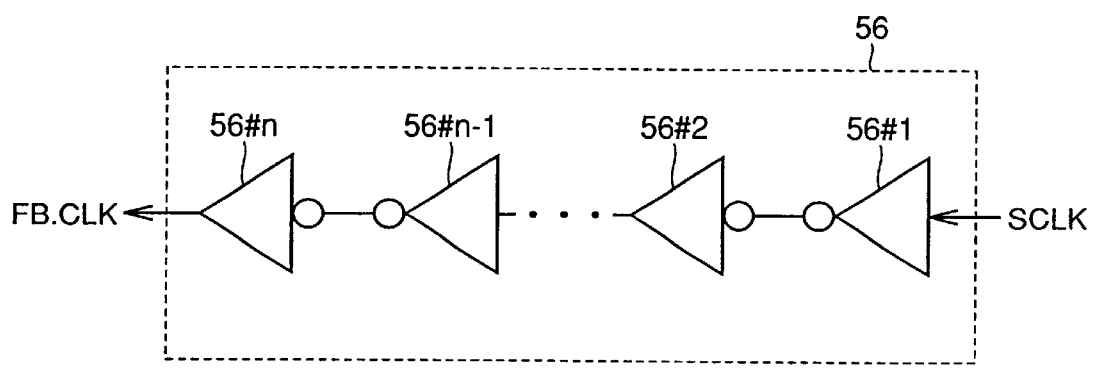
FIG. 7 is a circuit diagram showing a structure of a dummy circuit 56 of FIG. 2.

Referring to FIG. 7, dummy circuit 56 includes inverters 56#1–56#n connected in series, receiving source clock signal SCLK to output feed back clock signal FB.CLK. The delay time of dummy circuit 56 is adjusted so as to become equal to the time of source clock signal SCLK arriving at internal circuit 62 via the clock interconnections of clock supply circuit 58, clock driver 60 and internal circuit 62 shown in FIG. 2.

This adjustment can easily be realized by altering the number of stages and size of the inverter according to circuit simulation. The dummy circuit can be realized by a circuit including a transmission gate and the like rendered conductive in addition to the above-described inverters connected in series.

Since the driving capability of dummy circuit 56 can be set smaller than that of clock driver 60 that supplies the clock to the entire LSI, dummy circuit 56 can be realized with a small transistor. Therefore, the power consumed by dummy circuit 56 during standby is extremely lower than that consumed by the clock driver during operation.

Figure 8:
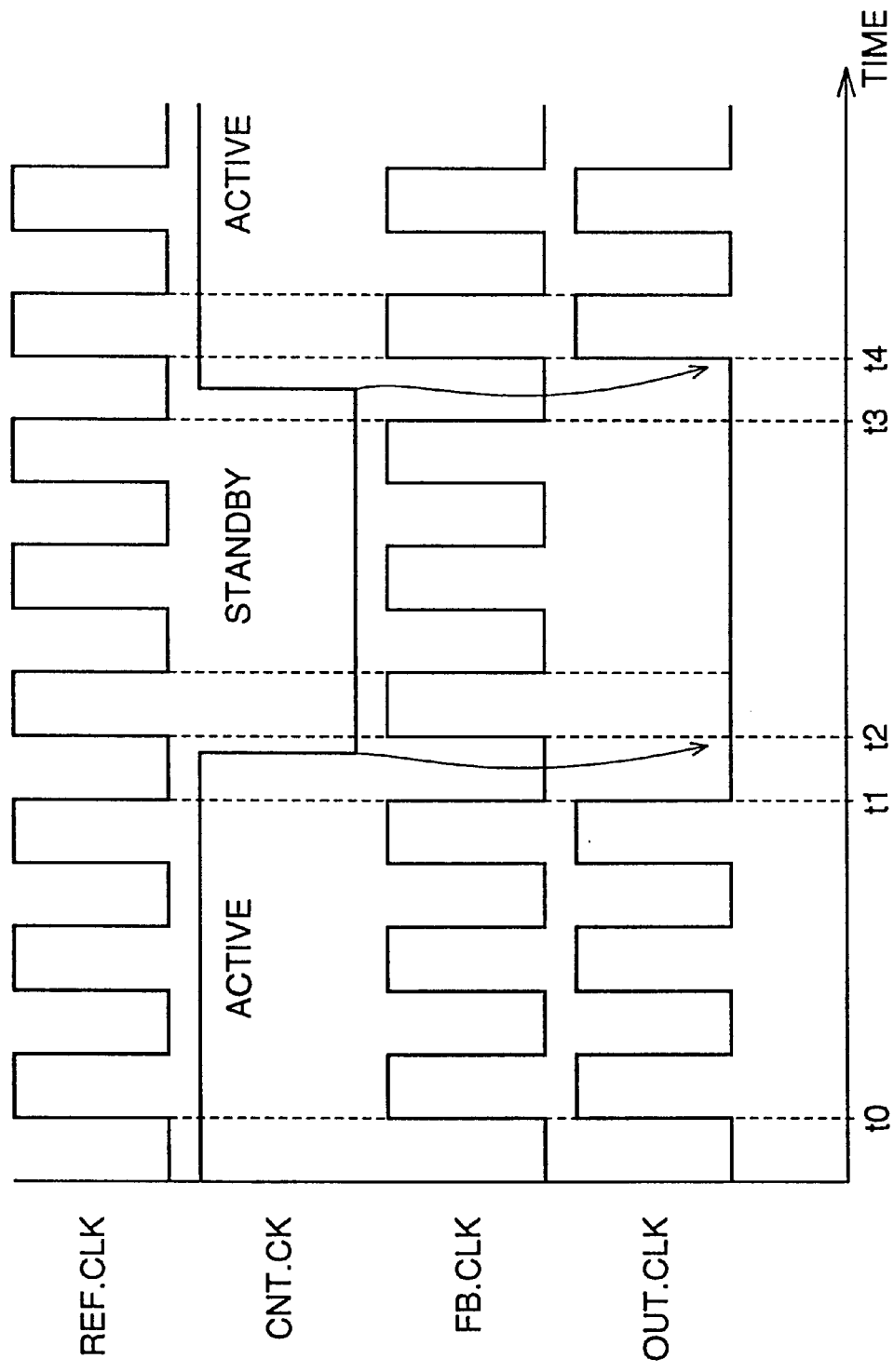
FIG. 8 is an operation waveform diagram to describe an operation of clock circuit 52 of FIG. 2.

FIG. 8 is an operation waveform diagram to describe the operation of clock circuit 52 of FIG. 2. In the normal operation at time t0–t1, control signal CNT.CK is at an H level (logical high). Source clock signal SCLK is transmitted to node N1.

The delay time of dummy circuit 56 is adjusted so as to become equal to the time of source clock signal SCLK arriving at internal circuit 62 through the clock interconnection of clock supply circuit 58, clock driver 60 and internal circuit 62.

Since the time of source clock signal SCLK to feed back clock signal FB.CLK which is the output of dummy circuit 56 is equal to the time of source clock signal SCLK to clock signal OUT.CLK applied to internal circuit 62, feed back clock signal FB.CLK is in phase with clock signal OUT.CLK.

Figure 17:
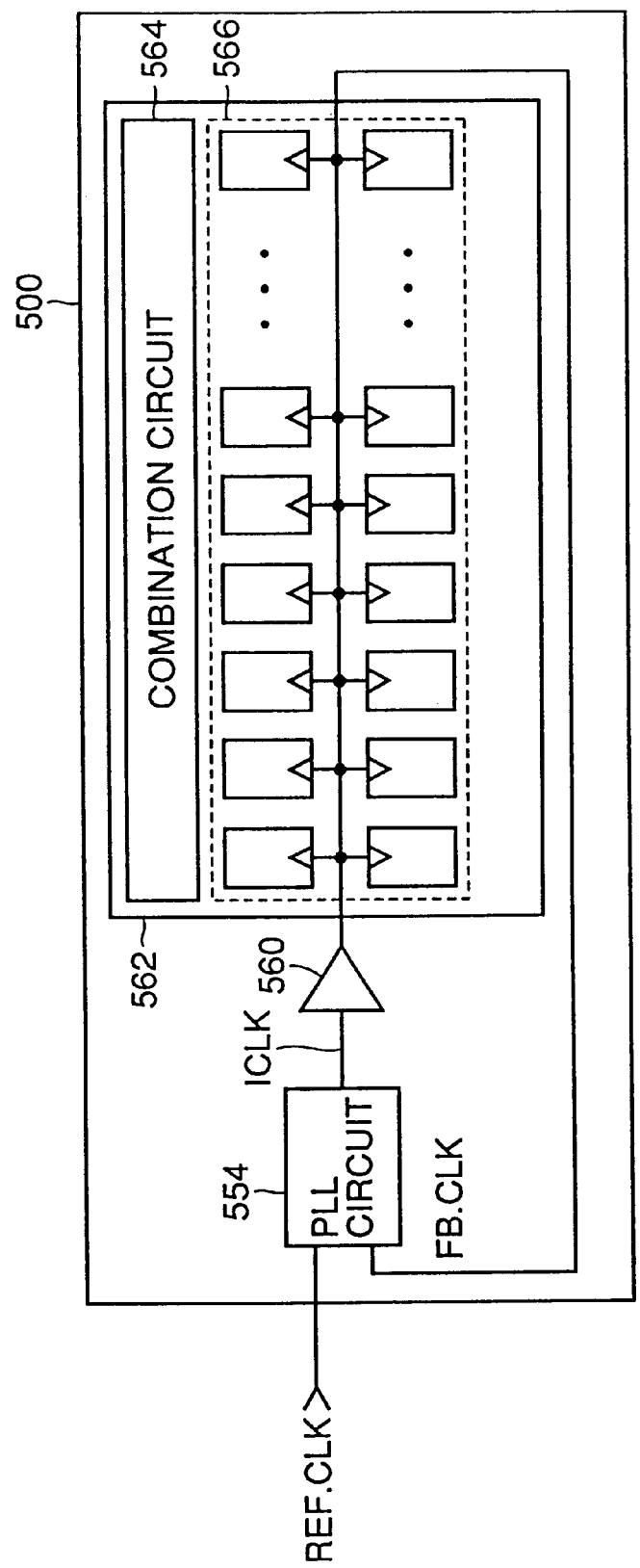
FIG. 17 schematically shows a structure of a conventional semiconductor device 500.

When synchronization is established so that the phase of clock signal REF.CLK is phase with feed back clock signal FB.CLK by PLL circuit 54, clock signal REF.CLK is in phase with clock signal OUT.CLK at the same time. Therefore, clock circuit 52 can generate a clock signal identical to that of the clock generation system of FIG. 17.

When control signal CNT.CK is pulled down from an H level to an L level at time t1–t2, node Ni is fixed at the L level, and clock signal OUT.CLK is fixed to the L level. In other words, the supply of a clock signal to latch circuit 66 is suppressed. However, synchronization between clock signal REF.CLK and feed back clock signal FB.CLK is maintained since signal generation circuit 53 maintains an operating state by the feed back loop of dummy circuit 56.

When the LSI returns to the operating state from the standby state, control signal CNT.CK is pulled up again to an H level at time t3–t4. In response, a synchronizing clock signal is transmitted to node N1 again, and applied to latch circuit 66 as clock signal OUT.CLK. Here, erroneous operation does not occur in latch circuit 66 since clock signal OUT.CLK in synchronization with signal REF.CLK is supplied right after cancel of the standby state.

There is a possibility of erroneous operation due to the output of a pulse of a narrow width in clock signal OUT.CLK unless control signal CNT.CK is not altered during the L level period of clock signal REF.CLK. Therefore, it is desired that the switching of clock signal CNT.CK is carried out at the timing shown in FIG. 8.

In this case, control signal CNT.CK can be switched independent of the switching timing by receiving control signal CNT.CK at a flipflop that operates according to clock signal REF.CLK or a corresponding clock signal inside or outside semiconductor device 50.

According to the semiconductor device of the first embodiment, power consumption during standby can be suppressed significantly by ceasing the output of clock driver 60 by control signal CNT.CK while maintaining clock synchronization by a dummy circuit 56 lower in power consumption than clock driver 60.

Since an unstable clock signal will not be supplied to the latch circuit in the transition from the standby state to the operating state, power consumption of the LSI can be reduced significantly without causing erroneous operation.

Figure 18:
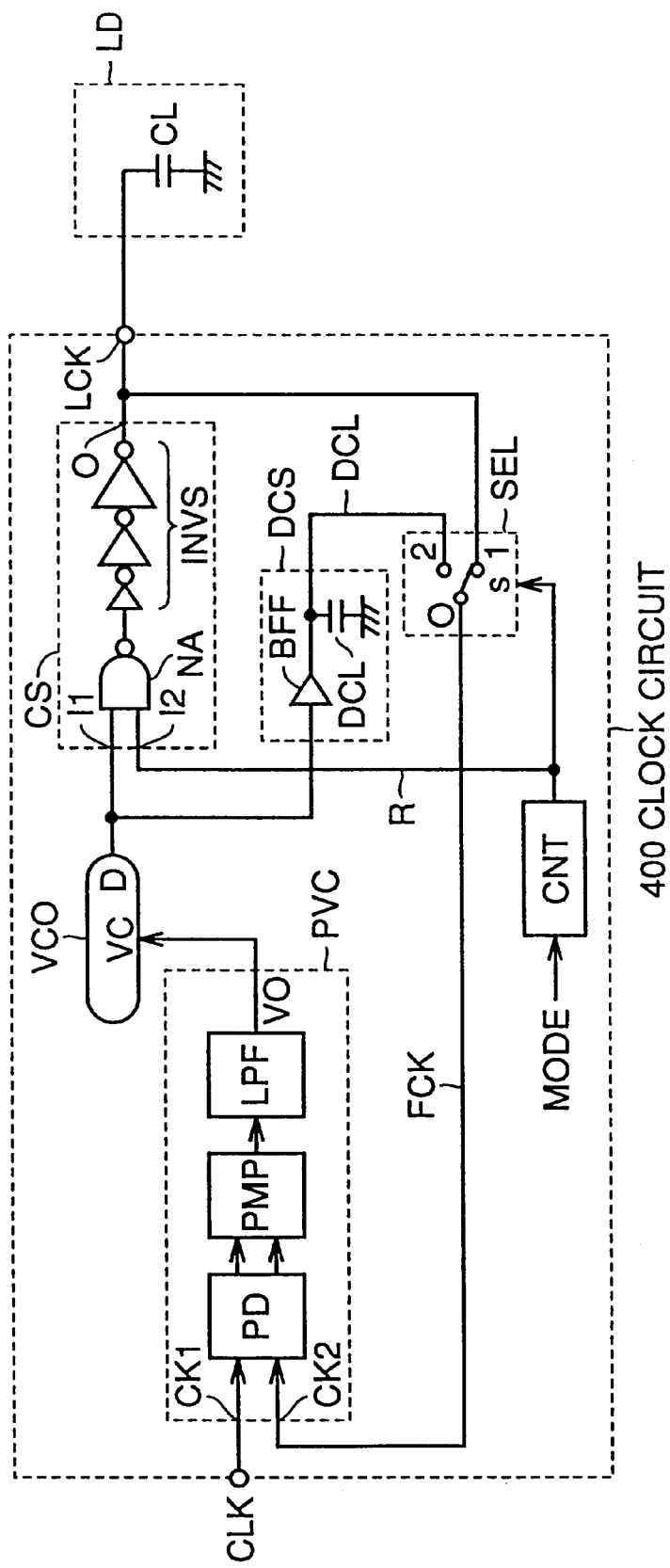
FIG. 18 is a circuit diagram showing a structure of a clock circuit 400 disclosed in Japanese Patent Laying-Open No. 7-202687.
Figure 19:
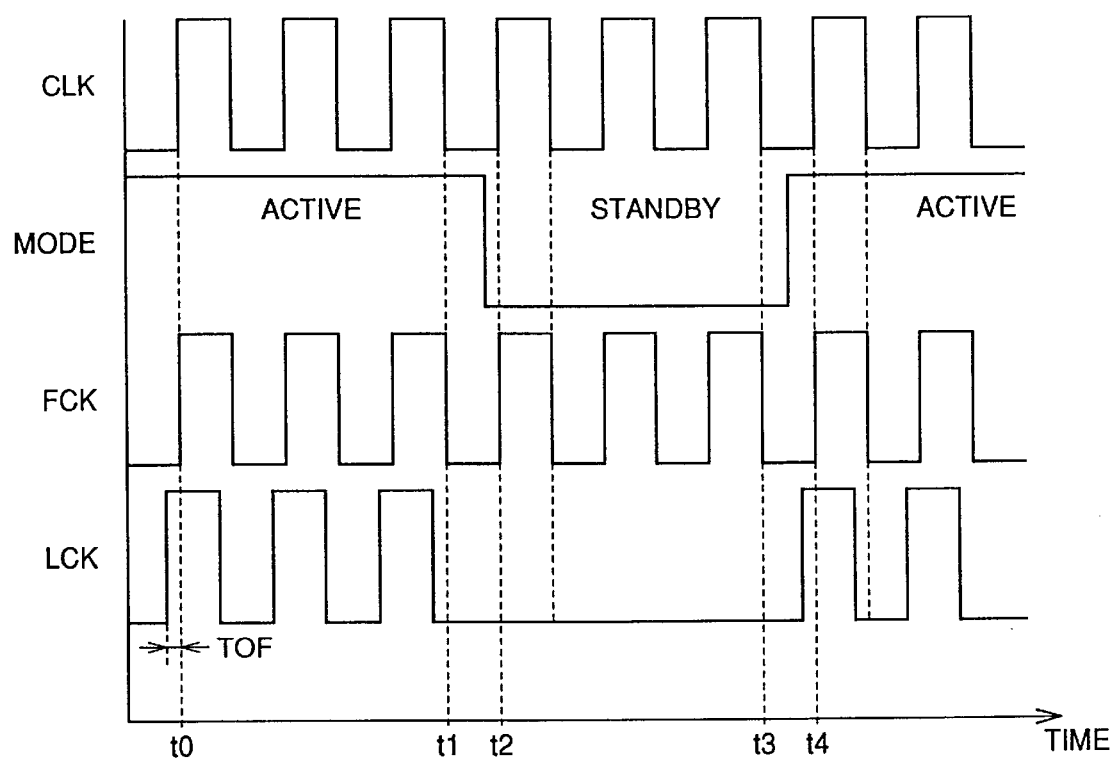
FIG. 19 is an operation waveform diagram to describe an operation of clock circuit 400 of FIG. 18.

The circuit of the present invention can be realized with a smaller number of transistors in comparison to the conventional circuit shown in FIG. 18 due to the absence of select circuit SEL. There is also the advantage that the phase difference between the control signal used in the internal latch and the externally applied clock signal can be reduced.

Although a switch by an AND circuit is employed as the control switch of the clock in the first embodiment, switching can be implemented by a selector circuit using a NAND circuit or transmission gate instead.

Second Embodiment

Figure 9:
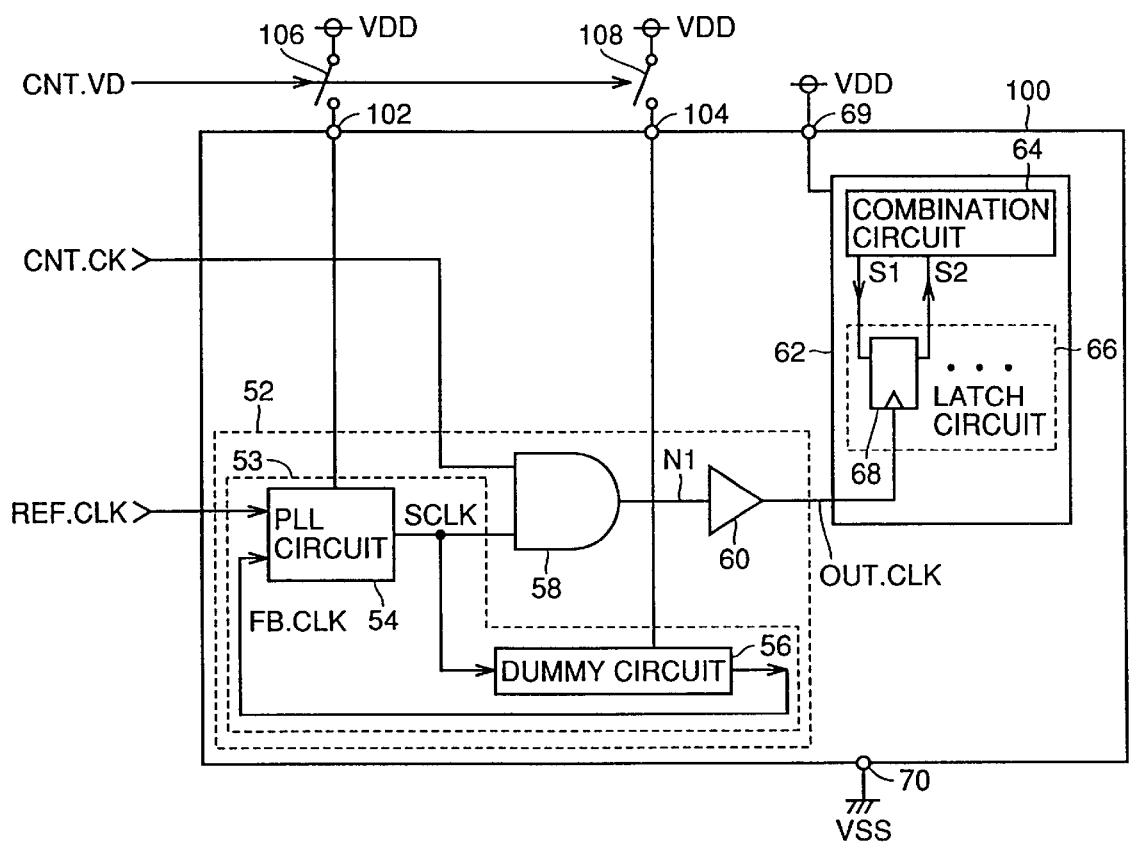
FIG. 9 is a circuit diagram showing a schematic structure of a semiconductor device 100 according to a second embodiment of the present invention.

A semiconductor device 100 of the second embodiment of the present invention is shown by the circuit diagram of FIG. 9.

Semiconductor device 100 of the second embodiment differs from semiconductor device 50 of FIG. 2 in that a terminal 102 connected to the sub power supply line to supply a power supply potential to PLL circuit 54 in the chip, and a terminal 104 connected to the second sub power supply line in the chip to supply the power supply potential to dummy circuit 56 are further provided in addition to terminal 69 connected to the main power supply line within the chip to supply the power supply potential. The remaining components are similar to those of semiconductor device 50 of the first embodiment, and description thereof will not be repeated.

Power supply terminals 102 and 104 are applied with power supply potential VDD by switches 106 and 108 rendered conductive in response to control signal CNT.VD.

Figure 10:
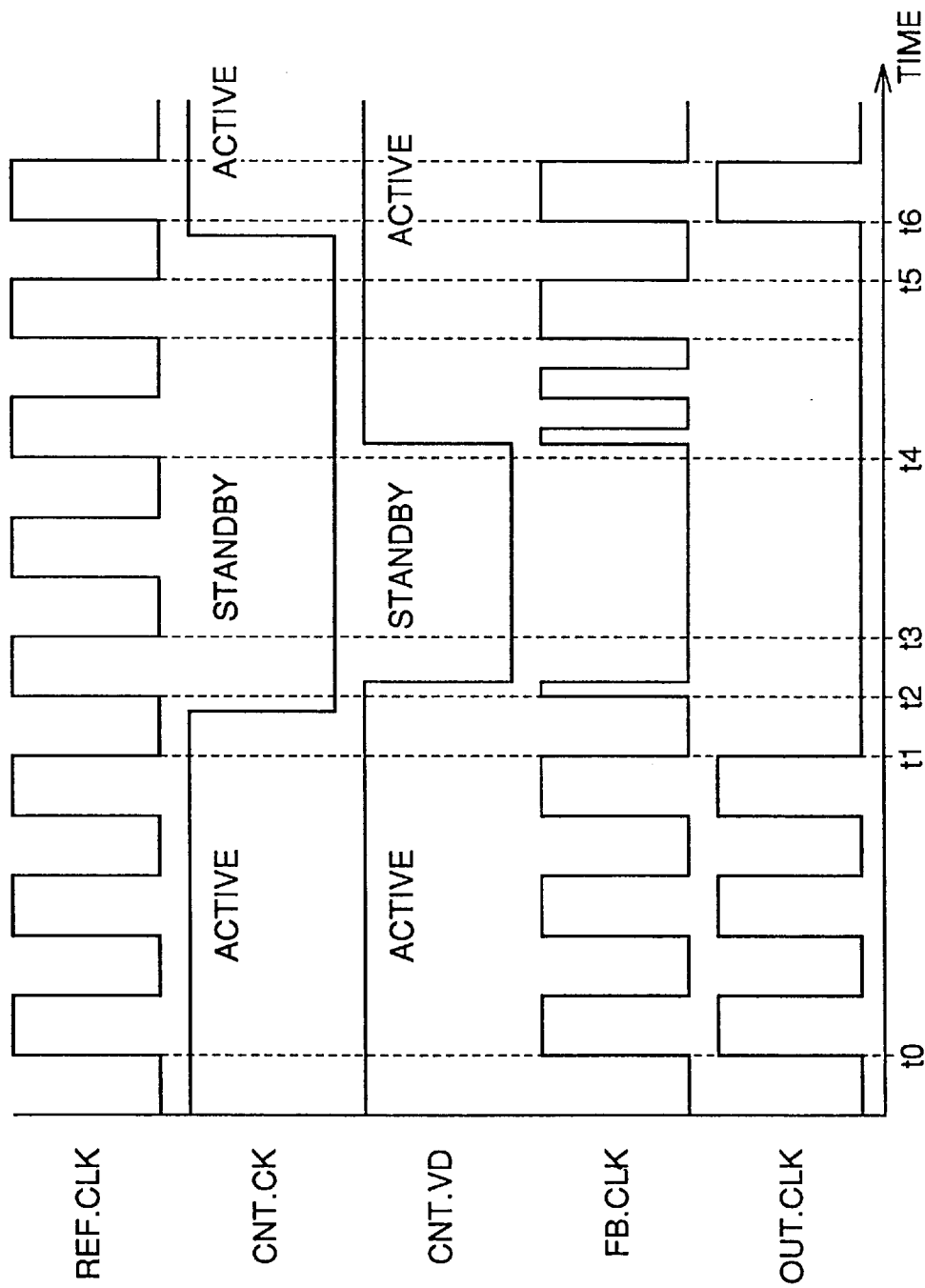
FIG. 10 is an operation waveform diagram to describe an operation of semiconductor device 100 of FIG. 9.

FIG. 10 is an operation waveform diagram to describe the operation of semiconductor device 100 of FIG. 9.

At time t0–t1, semiconductor device 100 is at an operating state. Switches 106 and 108 conduct. The power supply potential is supplied to PLL circuit 54 and dummy circuit 56. Clock signal OUT.CLK in synchronization with externally applied clock signal REF.CLK is applied to internal circuit 62.

At time t1–t2, control signal CNT.CK is pulled down from an H level to an L level. Clock signal OUT.CLK is fixed at the L level. Therefore, internal circuit 62 is at a standby state. Flipflop 68 is configured to maintain the current-held data when the clock input signal is fixed at the L level. Therefore, all the flipflops in latch circuit 66 maintain the data in the standby state. Internal circuit 62 can maintain the operating state of that time.

At time t2–t3, control signal CNT.VD is pulled down from an H level to an L level. Switches 106 and 108 connected to power supply terminals 102 and 104, respectively, are rendered nonconductive. Therefore, source clock signal SCLK generated from PLL circuit 54 is no longer output. Also, feed back clock signal FB.CLK is fixed at the L level. At time t3–t4, clock circuit 52 also attains a nonoperating state, similar to internal circuit 62. Thus, power consumption of semiconductor device 100 is further suppressed.

The above-described structure is particularly effective for reducing power consumption during the standby state since current flows constantly in the PLL circuit than in the normal logic circuit. A small leakage current flows to the transistor of the nonconductive state even when the logic circuit such as dummy circuit 56 is at the nonoperating state with the internal node fixed. By virtue of the above-described structure, the leakage current can be eliminated. Therefore, power consumption is further reduced.

The operation when returning from the standby state to the operating state will be described hereinafter.

At the t4–t5, control signal CNT.VD is pulled up to an H level from an L level. Therefore, power supply potential is supplied again to terminals 102 and 104. In response, PLL circuit 54 begins to output source clock signal SCLK. Clock circuit 52 begins to operate at an elapse of a predetermined time in synchronization with clock signal REF.CLK.

At time t5–t6when control signal CNT.CK is pulled up to an H level from an L level, clock signal OUT.CLK is applied to internal circuit 62 since the output of clock supply circuit 58 is rendered active. Thus, internal circuit 62 returns to an operating state.

By this structure, the current in PLL circuit 54 and dummy circuit 56 during the standby state can be reduced. Power consumption can further be reduced than that of semiconductor device 50 of the first embodiment.

In the second embodiment, terminals 102 and 104 are provided to control the supply of the power supply potential to PLL circuit 54 and dummy circuit 56 independent of that of the other circuit. Alternatively, one consolidated terminal can be used. Also, a terminal that controls supply of the ground potential can be provided in addition to terminal 70 instead of controlling the supply of the power supply potential. Simultaneous control of the supply of both the power supply potential and the ground potential may also be provided.

Third Embodiment

Figure 11:
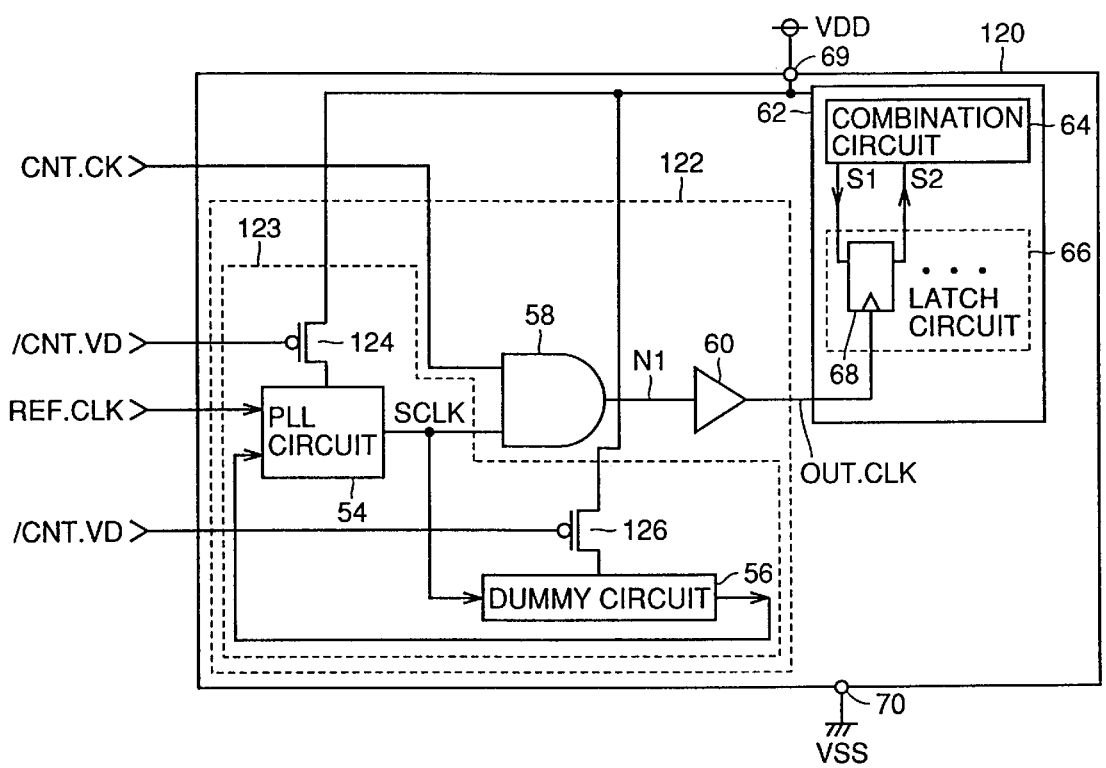
FIGS. 11, 12, 13 and 14 are circuit diagrams showing a structure of a semiconductor device 120, 140, 160, and 200, respectively, according to a third embodiment, a fourth embodiment, a fifth embodiment, and a sixth embodiment, respectively.

A semiconductor device 120 according to a third embodiment of the present invention is shown by the circuit diagram of FIG. 11.

Semiconductor device 120 of the third embodiment differs from semiconductor device 100 of FIG. 9 in that a clock circuit 122 is provided instead of terminals 102 and 104 and clock circuit 52. Clock circuit 122 includes a signal generation circuit 123 instead of signal generation circuit 53.

The remaining structure of semiconductor device 120 is similar to that of semiconductor device 100 of FIG. 9. Therefore, description thereof will not be repeated.

Signal generation circuit 123 differs from signal generation circuit 53 of FIG. 9 in that a transistor 124 controlling supply of the power supply potential to PLL circuit 54 according to a control signal /CNT.VD, and a transistor 126 controlling the supply of the power supply potential to dummy circuit 56 according to control signal /CNT.VD are further provided. Transistor 124 is provided between the main power supply line to which terminal 69 is connected and the first sub power supply line through which power supply current is applied to PLL circuit 54. Transistor 126 is provided between the main power supply line to which terminal 69 is connected and the second sub power supply line through which the power supply current is applied to dummy circuit 56.

The remaining structure is similar to that of signal generation circuit 53 of FIG. 9. Therefore, description thereof will not be repeated.

By the above-described structure, the advantages similar to those of semiconductor device 100 of the second embodiment are obtained. Furthermore, transistors 124 and 126, PLL circuit 54 and dummy circuit 56 can be integrated on the same chip. Therefore, the printed circuit board on which the semiconductor device is mounted can be made more compact.

In the third embodiment, transistors 124 and 126 functioning as switches are provided to control the supply of the power supply potential to PLL circuit 54 and dummy circuit 56, respectively. However, a transistor to control the supply of the ground potential to PLL circuit 54 and dummy circuit 56 can also be provided. In this case, an N channel MOS transistor is employed. Although separate transistors are provided corresponding to PLL circuit 54 and dummy circuit 56, one consolidated transistor can be provided instead. Alternatively, respective transistors can be provided at the power supply side and the ground side to control the supply of the power supply potential and the ground potential simultaneously.

Fourth Embodiment

Figure 12:
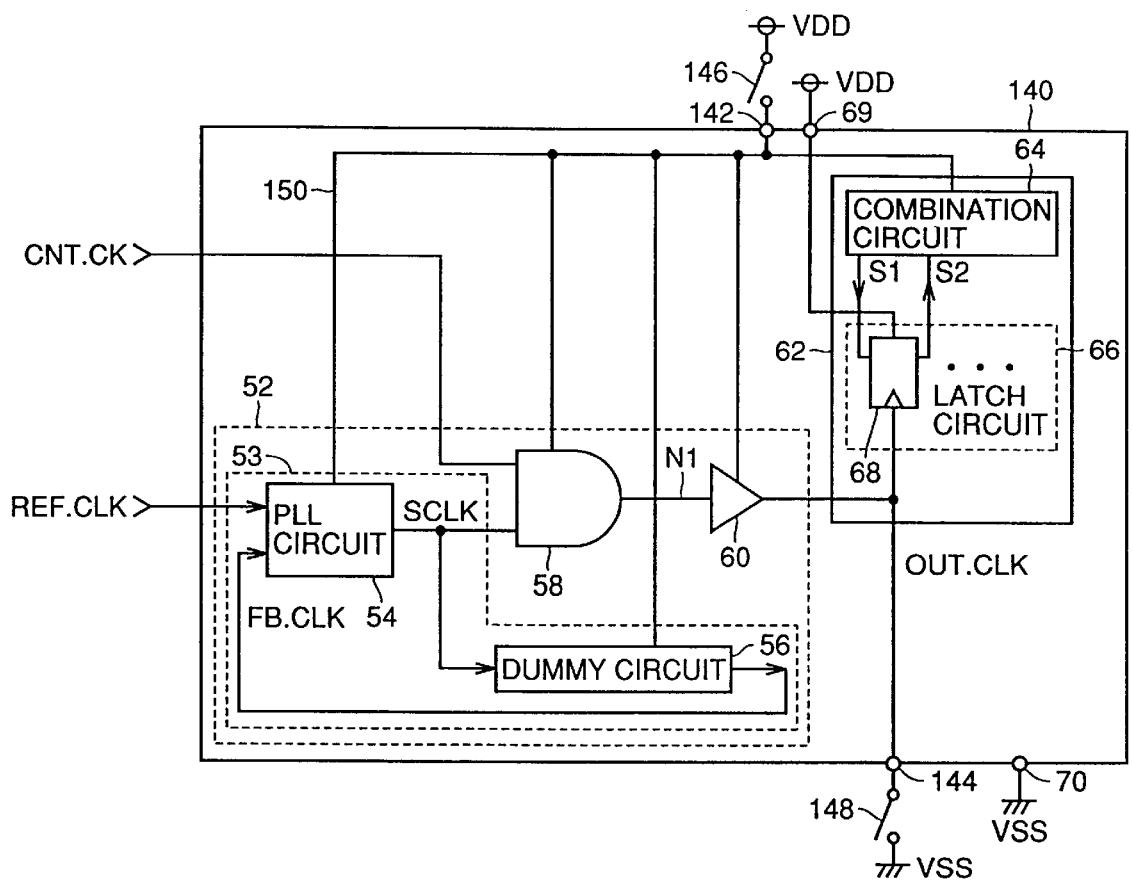

A semiconductor device 140 according to a fourth embodiment of the present invention is shown by the circuit diagram of FIG. 12.

Semiconductor device 140 of the fourth embodiment differs from semiconductor device 50 of FIG. 2 in that terminals 142 and 144 are provided in addition to terminals 69 and 70. Terminal 69 serves to provide externally applied power supply potential to the main power supply line through which the power supply potential of all the flipflops in latch circuit 66 is supplied. Terminal 142 serves to apply power supply potential to a sub power supply line 150 through which the power supply potential is supplied to PLL circuit 54, clock supply circuit 58, dummy circuit 56, clock driver 60 and combination circuit 64. Terminal 14 serves to fix clock signal OUT.CLK applied to latch circuit 66 at the ground potential level in a standby state. Ground potential VSS is applied to terminal 144 by switch 148. Power supply potential VDD is applied to terminal 142 by switch 146.

The operation of semiconductor device 140 will be described hereinafter.

In an operating state, switch 146 is set at the conductive state and switch 148 is set at the nonconductive state. In the transition from the operating state to the standby state, control signal CNT.CK is driven down from an H level to an L level, whereby clock signal OUT.CLK is fixed at the L level. When internal circuit 62 attains a standby state, switch 148 is rendered conductive. As a result, signal OUT.CLK is fixed to the L level. Then, switch 146 is rendered nonconductive. In response, all the circuits other than latch circuit 66 are disconnected from the power supply. Therefore, power consumption is reduced. Here, the power supply potential from terminal 69 is applied to latch circuit 66. The clock node of latch circuit 66 is fixed at the level of ground potential VSS. Therefore, the data held by the latch circuit is not damaged.

The operation of returning to the operating state from the standby state will be described hereinafter. Upon conduction of switch 146, switch 148 is rendered nonconductive. Following synchronization of PLL circuit 54, control signal CNT.CK attains an H level. A synchronizing clock signal is supplied to internal circuit 62.

The fourth embodiment is described in which the supply of the power to all the circuits other than latch circuit 66 is suppressed by switch 146 in the standby state by provision of terminal 142. However, the supply of the ground potential to all the circuits other than latch circuit 66 can be controlled instead. To this end, a terminal can be provided in addition to terminal 70 to effect control by switching. Furthermore, the supply of both the power supply potential and the ground potential can be controlled simultaneously to obtain a similar advantage. Power supply potential VDD can be supplied instead of ground potential VSS to fix clock signal OUT.CLK as long as the data is not damaged with the clock node of latch circuit 66 at an H level with respect to switch 148.

Fifth Embodiment

Figure 13:
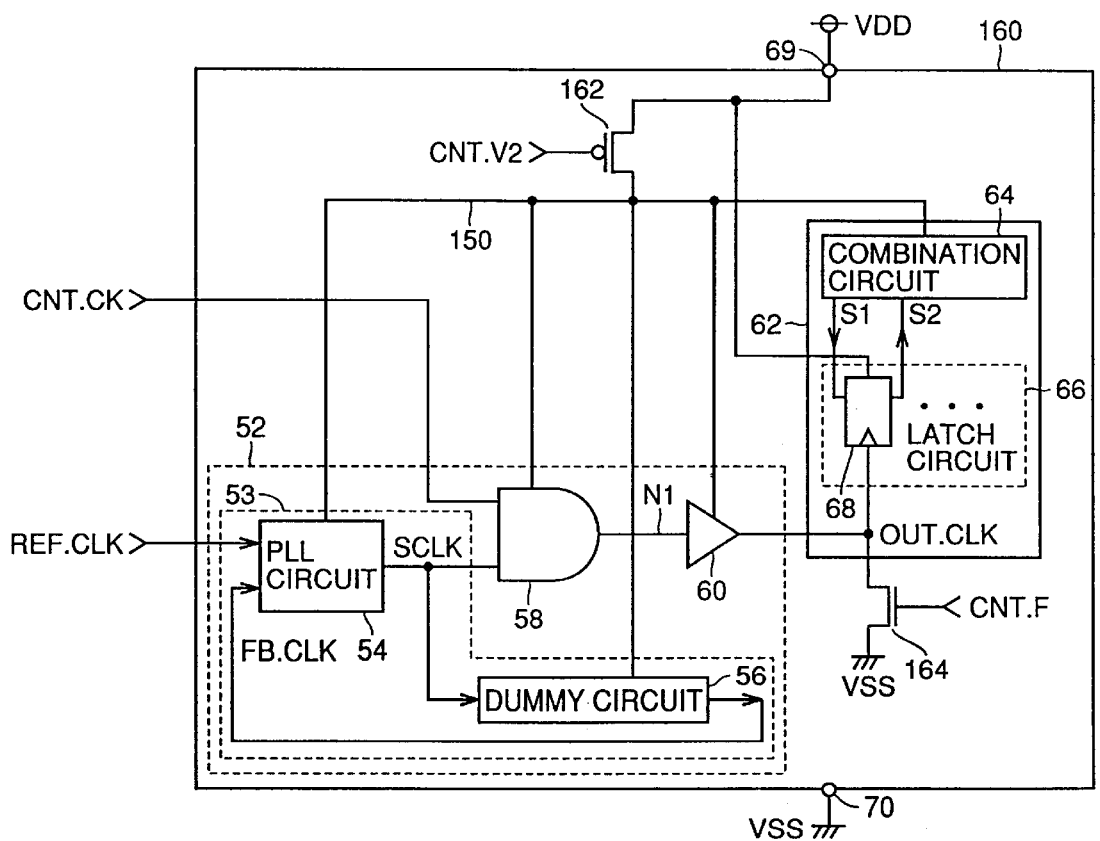

A semiconductor device 160 according to a fifth embodiment of the present invention is shown by the circuit diagram of FIG. 13.

Semiconductor device 160 of the fifth embodiment differs from semiconductor device 140 of FIG. 12 in that transistors 162 and 164 are provided instead of terminals 142 and 144. The structure of the remaining components are similar to those of semiconductor device 140 of FIG. 12, and description thereof will not be repeated.

Transistor 162 is a P channel MOS transistor, connected between the power supply node to which power supply potential VDD is applied and sub power supply line 150. A control signal CNT.V2 is applied to the gate of transistor 162.

Transistor 164 is an N channel MOS transistor, connected between the ground node to which ground potential VSS is applied and the clock node to which clock signal OUT.CLK is applied. A control signal CNT.F is applied to the gate of transistor 164.

Semiconductor device 160 of the fifth embodiment corresponds to semiconductor device 140 of the fourth embodiment with externally provided switch 146 replaced with transistor 162 provided internally and a switch 148 replaced with transistor 164. Therefore, the operation of semiconductor device 160 of the fifth embodiment is similar to semiconductor device 140 of the fourth embodiment, and description thereof will not be repeated.

By the above state, advantages similar to those of the fourth embodiment can be achieved. Furthermore, PLL circuit 54, dummy circuit 56, clock supply circuit 58, clock driver 60, latch circuit 66, combination circuit 64 corresponding to circuits other than latch circuit 66, and transistors 162 and 164 can be integrated on the same chip. Although the fifth embodiment is described in which transistor 162 corresponding to a switch by a P channel MOS transistor is provided to control the supply of the power supply potential to all the circuits other than latch circuit 66, control can be provided to supply the ground potential to the all the circuits other than latch circuit 66 instead. In this case, an N channel MOS transistor is preferable. Also, the same advantage can be obtained by providing control of the supply of both the power supply potential and the ground potential to the all the circuits other than latch circuit 66.

Furthermore, power supply potential VDD can be applied instead of ground potential VSS to fix the clock node in the standby state as long as the data is not damaged with the clock node of latch circuit 66 at the H level. In this case, similar advantage can be obtained by replacing N channel MOS transistor 164 with a P channel MOS transistor.

Sixth Embodiment

Figure 14:
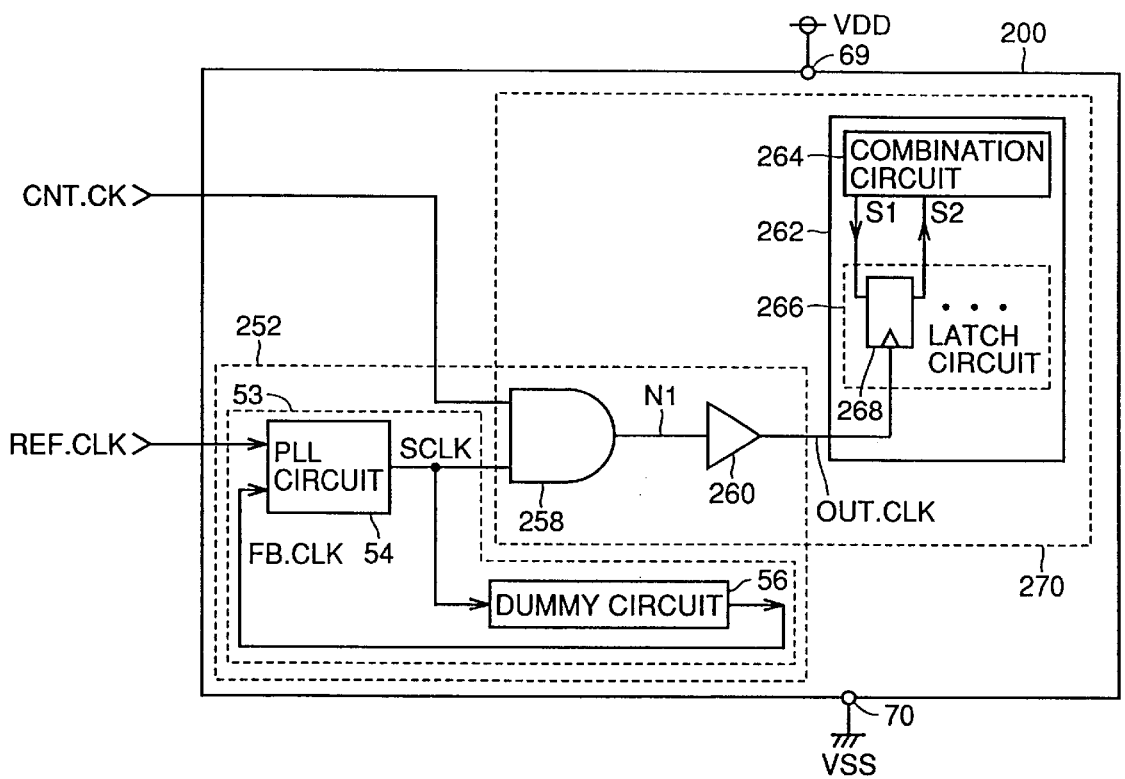

A semiconductor device 200 according to a sixth embodiment of the present invention is shown in the circuit diagram of FIG. 14. Semiconductor device 200 of the sixth embodiment differs from semiconductor device 50 of the first embodiment in that a clock circuit 252 and an internal circuit 262 are provided instead of clock circuit 52 and internal circuit 62, respectively. The remaining structure is similar to that of semiconductor device 50 of the first embodiment. Therefore, description thereof will not be repeated.

Clock circuit 252 differs from clock circuit 52 of FIG. 2 in that a clock supply circuit 258 and a clock driver 260 are provided instead of clock supply circuit 58 and clock driver 60, respectively. The remaining structure is similar to that of clock circuit 52, and description thereof will not be repeated.

Internal circuit 262 differs from internal circuit 62 of FIG. 2 in that a latch circuit 262 and a combination circuit 264 are provided instead of latch circuit 66 and combination circuit 64, respectively.

Here, a region 270 will be described. Region 270 includes clock supply circuit 258, clock driver 260 and internal circuit 262. Each circuit in region 270 is formed by a transistor that can apply reverse bias to the back gate. In other words, the potential applied to the back gate can be switched in each MOS transistor. More specifically, the potential can be switched between the power supply potential and a predetermined potential higher than the power supply potential to be provided to the back gate for the P channel MOS transistor. For the N channel MOS transistor, the potential applied to the back gate can be switched between the ground potential and a negative potential.

Figure 15:
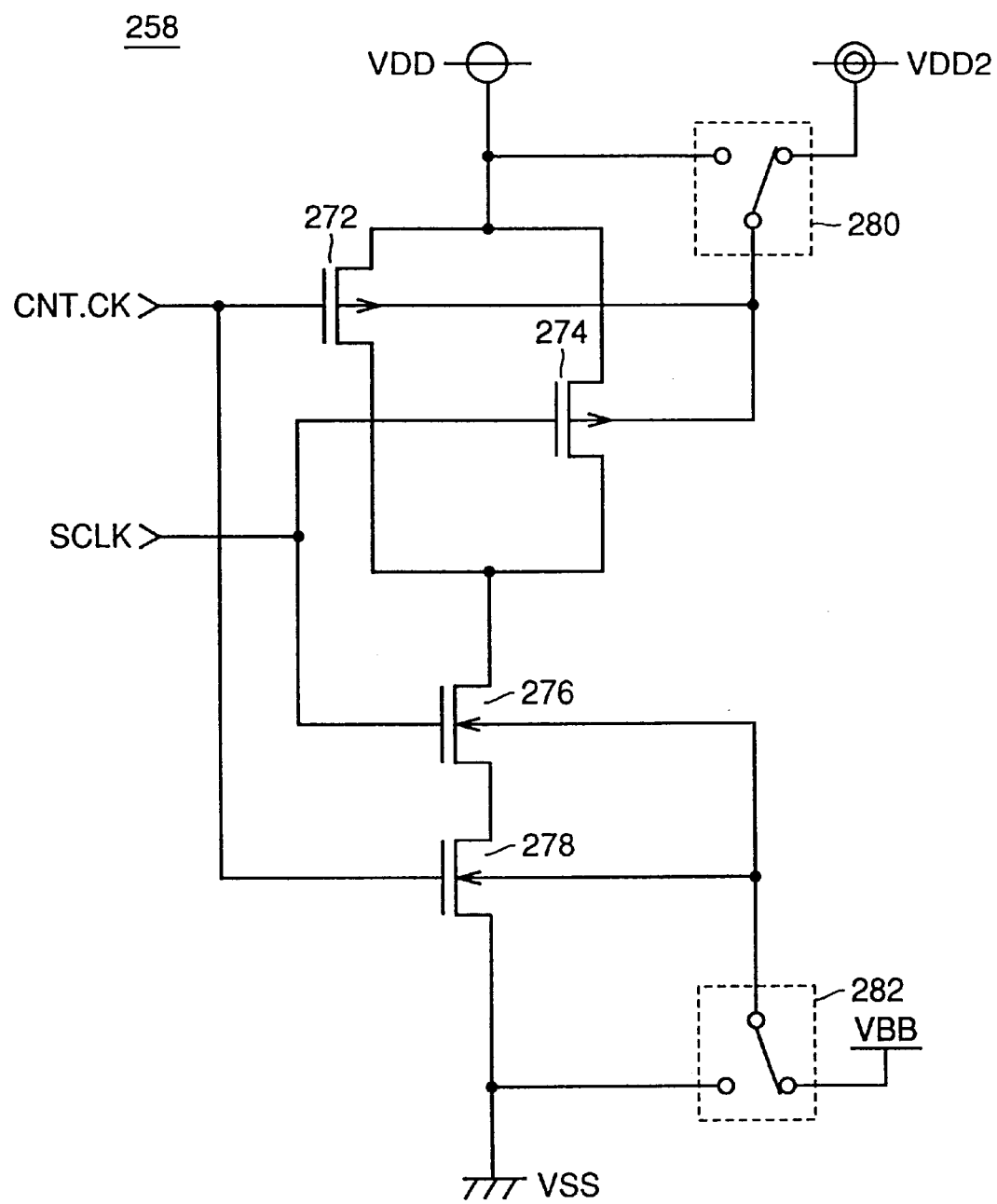
FIG. 15 is a circuit diagram showing a structure of a clock supply circuit 258 of FIG. 14.

Referring to FIG. 15, a clock supply circuit 258 is an AND circuit. Clock supply circuit 258 includes an N channel MOS transistor 278 having its source coupled to ground potential VSS and receiving control signal CNT.CK at its gate, an N channel MOS transistor 276 having its source connected to the drain of N channel MOS transistor 278 and receiving source clock signal SCLK at its gate, a P channel MOS transistor 272 having its source coupled to power supply potential VDD, its drain connected to the drain of N channel MOS transistor 276, and receiving control signal CNT.CK at its gate, and a P channel MOS transistor 274 having its source coupled to power supply potential VDD, its drain connected to the drain of N channel MOS transistor 276, and receiving source clock signal SCLK at its gate.

Clock supply circuit 258 further includes a switch circuit 280 selectively applying power supply potential VDD or a power supply potential VDD2 higher than power supply potential VDD to the back gates of P channel MOS transistors 272 and 274, and a switch circuit 282 selectively applying ground potential VSS or a negative potential VBB lower than ground potential VSS to the back gates of N channel MOS transistors 276 and 278.

Although a clock supply circuit 258 of transistors are shown as an example in the circuit diagram, the back gate of respective transistors in clock driver 260, combination circuit 264 and latch circuit 266 are also applied with potentials switched between the operating state and standby state.

The operation will be described here.

Referring to FIG. 14 again, power supply potential is applied to the back gate of P channel MOS transistor in the circuit located in region 270.

In the transition from the operating state to the standby state, control signal CNT.CK is pulled down to an L level, and clock signal OUT.CLK is fixed to the L level. A potential higher than the power supply potential is applied to back gate of the P channel MOS transistor in region 270. Also, a negative potential is applied to the back gate of the N channel MOS transistor in region 270. More specifically, the P and N channel MOS transistors in region 270 are set at the state where the back gates are both reversely biased.

When the back gate of the transistor is reversely biased, the threshold voltage rises by the substrate bias effect. A reverse-biased state implies that the potential of the substrate portion where the channel is formed, i.e. the back gate, is higher than the potential at the source in the case of a P channel MOS transistor. Increase of the threshold voltage results in a smaller leakage current during the non-operating state of the transistor. Therefore, the leakage current of the transistors of clock supply circuit 258, clock driver 260, latch circuit 266, and combination circuit 264 in the standby state becomes smaller, so that power consumption is reduced.

In the operation of returning from the standby state to the operating state, the back gate potentials of the P channel and N channel MOS transistors in region 270 are returned to power supply potential VDD and ground potential VSS, respectively, and the level of the threshold voltage returns to the former level. Then, following synchronization of PLL circuit 54, control signal CNT.CK is pulled up to an H level, whereby a synchronizing clock signal is supplied to internal circuit 262.

According to the above-described structure, leakage current during the standby state can be lowered. Therefore, power consumption can further be reduced than that of the first embodiment.

The operation of PLL circuit 54 and dummy circuit 56 can be suppressed to further reduce power consumption by applying the structure described in the second and third embodiments to the structure described in the sixth embodiment. In this case, following suppression of the clock supply by pulling down control signal CNT.CK to an L level from an H level, supply of the power supply potential to PLL circuit 54 and dummy circuit 56 is ceased. Also, the back gate of the transistors in region 270 is reversely biased. The order of the operation of disconnecting the power supply and the operation of applying reverse bias on the back gate is arbitrary.

In the operation of returning to the operating state from the standby state, the potential of the back gate of the transistors in region 270 is returned to the former level after supply of the power is initiated to PLL circuit 54 and dummy circuit 56. More specifically, the power of the back gate of the P channel MOS transistor is returned to the level of power supply potential, and the potential of the back gate of the N channel MOS transistor is returned to the level of the ground potential VSS.

Then, control signal CNT.CK is pulled up to an H level, and the clock is supplied to internal circuit 262. The operation of initiating supply of the power to PLL circuit 54 and dummy circuit 56 and the operation of returning the potential of the back gate of the transistor to the former level is arbitrary.

In the sixth embodiment, the power supply potential is applied to the source and a potential higher than the power supply potential is applied to the back gate in order to establish a reverse-biased state on the back gate of the P channel MOS transistor. However, this can be implemented by another method. For example, (a) set the potential of the source lower than the power supply potential with the back gate of the P channel MOS transistor at the level of the power supply potential; (b) set the potential of the back gate and the source higher than the power supply potential, and with the back gate having a higher potential; (c) set the potential of the back gate and the source lower than the power supply potential, and set the potential of the back gate higher than the power supply potential.

The method of applying reverse-bias on the back gate of an N channel MOS transistor is set forth in the following. (e) Apply ground potential to the back gate of the N channel MOS transistor, and set the potential of the source higher than the ground potential; (f) set the potential of the back gate and the source lower than the ground potential, and with the back gate having a lower potential than the source; (g) setting the potential of the back gate and the source higher than the ground potential, with the potential of the back gate lower than that of the source; (h) set the potential of the source higher than the ground potential, and set the potential of the back gate lower than the ground potential. Various methods are possible, and either method can be employed.

Seventh Embodiment

Figure 16:
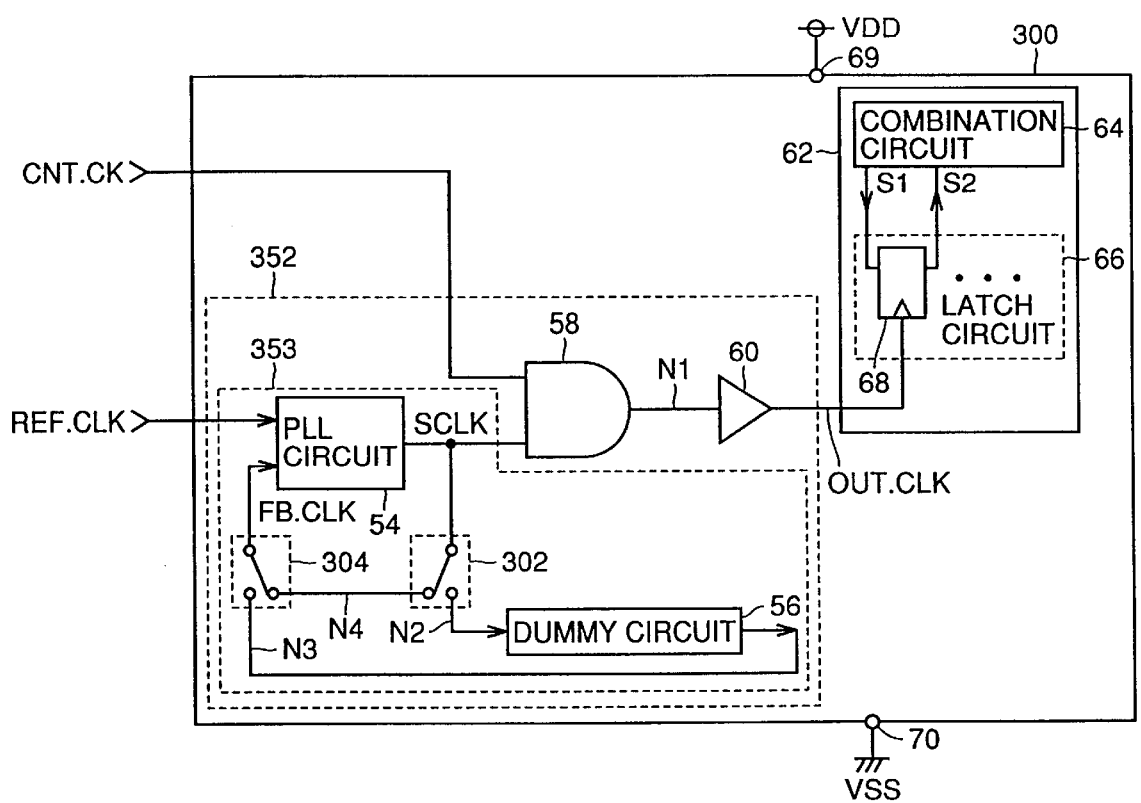
FIG. 16 is a circuit diagram showing a structure of a semiconductor device 300 according to a seventh embodiment of the present invention.

A semiconductor device 300 according to a seventh embodiment of the present invention is shown by the circuit diagram of FIG. 16.

Semiconductor device 300 of the seventh embodiment differs from semiconductor device 50 of FIG. 2 in that a clock circuit 352 is provided instead of clock circuit 52. Clock circuit 352 includes a signal generation circuit 353 instead of signal generation circuit 53. The remaining structure is similar to that of semiconductor device 50, and description thereof will not be repeated.

Signal generation circuit 353 differs from signal generation circuit 53 in that switch circuits 304 and 302 are further provided. Switch circuit 302 selectively applies source clock signal SCLK to a node N2 which is the input node of the dummy circuit or a node N4. Switch circuit 304 receives a signal from a node N3 which is the output node of the dummy circuit or node N4 to apply the received signal to PLL circuit 54 as feed back clock signal FB.CLK. The remaining structure is similar to that of signal generation circuit 53 of FIG. 2, and description thereof will not be repeated.

The operation will be described hereinafter.

In an operating state, switch 302 is connected to node N2. Switch 304 is connected to node N3.

In the transition from the operating state to the standby state, control signal CNT.CK is pulled down to set internal circuit 62 at a standby state. Then, switches 302 and 304 are connected to node N4. Accordingly, PLL circuit 54 locks without a signal fed back from dummy circuit 56. However, since the delay time of dummy circuit 56 is not taken into account, PLL circuit 54 in the locked state outputs clock signal OUT.CLK having a frequency identical to that of clock signal REF.CLK, but offset in phase by the delay time of dummy circuit 56.

In the operation of returning to the operating state from the standby state, switch 302 is connected to node N2, and switch 304 is connected to node N3. After establishing a proper synchronizing clock, control signal CNT.CK is pulled up again, whereby a clock signal is supplied to internal circuit 62. Thus, the operating state is attained.

By the above structure, dummy circuit 56 does not operate in a standby state. Therefore, power consumption is further reduced during the standby state than that of the first embodiment. Also, since PLL circuit 54 locks at a frequency identical to that of externally applied clock signal REF.CLK in the standby state, the time required for PLL circuit 54 to lock completely is reduced when returning from the standby state in contrast to that of the second embodiment. Thus, the operation can rapidly return to the normal operating state from the standby state.

Although a PLL circuit was employed as the clock synchronizing circuit in the above first to seventh embodiments, the present invention is applicable to the case where another clock synchronizing circuit such as a DLL (Delay Locked Loop) circuit is incorporated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, having a standby mode and an active mode of operation, comprising:
   a synchronizing clock generation circuit generating a source clock signal in synchronization with an external clock signal, said synchronizing clock generation circuit including
      a clock delay circuit delaying, for a particular delay period, said source clock signal to output a feed back clock signal, and
      a signal generation circuit generating said source clock signal according to a phase difference between said external clock signal and said feed back signal when said device is operating in said active mode and when said device is operating in said standby mode;
   a clock supply circuit receiving said source clock signal and configured
      to output an intermediate clock signal via an output when said device is operating in said active mode, and
      to inactivate the output when said device is operating in said standby mode;
   a clock transmission unit transmitting said intermediate clock signal; and
   an internal circuit receiving an internal clock signal corresponding to said intermediate clock signal from said clock transmission unit to carry out a predetermined operation, said internal circuit including
      a data retain circuit receiving and retaining data according to said internal clock signal.

2. The semiconductor device according to claim 1, wherein said particular delay period is substantially equal to a total time of a delay time of said clock supply circuit and said clock transmission unit.

3. The semiconductor device according to claim 2, wherein said clock delay circuit includes a plurality of inverters connected in series, having a delay time corresponding to said total time.

4. The semiconductor device according to claim 1, wherein said clock supply circuit receives a clock activation signal, said clock activation signal having either an activated or inactivated state, and is configured
   to output said intermediate clock signal, via the output, when said clock activation signal is activated, and
   to fix a level of the output when said clock activation signal is inactivated.

5. The semiconductor device according to claim 4, wherein said clock supply circuit includes an AND circuit receiving said clock activation signal and said source clock signal.

6. The semiconductor device according to claim 1, wherein said signal generation circuit comprises
   a phase comparator comparing said feed back clock signal with said external clock signal to output a phase different signal according to phase difference between said external clock signal and said feed back clock signal,
   a frequency control circuit providing a clock frequency control signal according to said phase difference signal, and
   a frequency variable oscillation circuit altering frequency of said source clock signal for output according to said clock frequency control signal.

7. A semiconductor device comprising:
   a synchronizing clock generation circuit generating a source clock signal in synchronization with an external clock signal, said synchronizing clock generation circuit including
      a clock delay circuit delaying said source clock signal to output a feed back clock signal, and
      a signal generation circuit generating said source clock signal according to a phase difference between said external clock signal and said feed back signal;
   a clock supply circuit, having an active and standby mode of operation, receiving said source clock signal to output, via an output, an intermediate clock signal when in said active mode, and to render the output inactive when in said standby mode;
   a clock transmission unit transmitting said intermediate clock signal;
   an internal circuit receiving an internal clock signal corresponding to said intermediate clock signal from said clock transmission unit to carry out a predetermined operation, said internal circuit including
      a data retain circuit receiving and retaining data according to said internal clock signal;
   a main power supply line supplying a first operating current to said data retain circuit; and
   a sub power supply line provided independent of said main power supply line, supplying a second operating current to said signal generation circuit.

8. The semiconductor device according to claim 7, further comprising:
   a main power supply terminal to which said first operating current is externally supplied; and
   a sub power supply terminal to which said second operating current is externally applied in said active mode, and to which supply of an operating current is ceased in said standby mode.

9. The semiconductor device according to claim 7, further comprising a current supply circuit provided between said main power supply line and said sub power supply line, supplying said second operating current to said sub power supply line from said main power supply line in said active mode, and ceasing supply of said second operating current in said standby mode.

10. The semiconductor device according to claim 7, wherein said data retain circuit comprises a latch circuit receiving and retaining data according to said internal clock signal,
   wherein said internal circuit further comprises a logic circuit transferring data with said latch circuit to carry out a logic operation,
   said sub power supply line supplying a third operating current and a fourth operating current to said logic circuit and said clock supply circuit, respectively.

11. The semiconductor device according to claim 10, further comprising:
   a main power supply terminal to which said first operating current is externally supplied; and a sub power supply terminal to which said second, third, and fourth operating currents are externally supplied in said active mode, and to which supply of said second, third, and fourth operating currents is ceased in said standby mode.

12. The semiconductor device according to claim 10, further comprising a current supply circuit provided between said main power supply line and said sub power supply line to supply said second, third, and fourth operating currents from said main power supply line to said sub power supply line in said active mode, and to cease supply of said second, third and fourth operating currents in said standby mode.

13. The semiconductor device according to claim 10, further comprising a clock fix circuit applying a predetermined potential to said clock transmission unit to fix a level of said internal clock signal.

14. A semiconductor device comprising:
a synchronizing clock generation circuit generating a source clock signal in synchronization with an external clock signal, said synchronizing clock generation circuit including
a clock delay circuit delaying said source clock signal to output a feed back clock signal, and
a signal generation circuit generating said source clock signal according to a phase difference between said external clock signal and said feed back signal;
a clock supply circuit, having an active and standby mode of operation, receiving said source clock signal to output, via an output, an intermediate clock signal when in said active mode of an operation mode, and to render the output inactive when in said standby mode of said operation mode, said clock supply circuit including
an MOS transistor having an absolute value of phase difference between a back gate and source set to a first value when said clock supply circuit is operating in said active mode and set to a second value greater than said first value when said clock supply circuit is operating in said standby mode;
a clock transmission unit transmitting said intermediate clock signal;
an internal circuit receiving an internal clock signal corresponding to said intermediate clock signal from said clock transmission unit to carry out a predetermined operation, said internal circuit including a data retain circuit receiving and retaining data according to said internal clock signal.

15. The semiconductor device according to claim 14, wherein said clock supply circuit further includes a switch circuit switching potential applied to the back gate of said MOS transistor according to said operation mode.

16. A semiconductor device comprising:
a synchronizing clock generation circuit generating a source clock signal in synchronization with an external clock signal, said synchronizing clock generation circuit including
a clock delay circuit delaying said source clock signal to output a feed back clock signal, and
a signal generation circuit generating said source clock signal according to a phase difference between said external clock signal and said feed back signal;
a clock supply circuit, having an active and standby mode of operation, receiving said source clock signal to output, via an output, an intermediate clock signal when in said active mode, and to render the output inactive when in said standby mode;
a clock transmission unit transmitting said intermediate clock signal;
an internal circuit receiving an internal clock signal corresponding to said intermediate clock signal from said clock transmission unit to carry out a predetermined operation, said internal circuit including
an MOS transistor having an absolute value of potential difference between a back gate and source set to a first value when said clock supply circuit is operating in said active mode and set to a second value greater than said first value when said clock supply circuit is operating in said standby mode.

17. A semiconductor device, having an active and standby mode of operation, comprising:
a synchronizing clock generation circuit generating a source clock signal in synchronization with an external clock signal, said synchronizing clock generation circuit including
a clock delay circuit delaying an input signal,
a switch circuit configured
to apply said source clock signal to said clock delay circuit as said input signal and to provide an output of said clock delay circuit as a feed back clock signal when said device is in said active mode, and
to apply said source clock signal directly as a feed back clock signal and to cease supply of said source clock signal to said clock delay circuit when said device is in said standby mode; and
a signal generation circuit generating said source clock signal according to a phase difference between said external clock signal and said feed back clock signal;
a clock supply circuit receiving said source clock signal to output, via an output, an intermediate clock signal when said device is in said active mode, and rendering the output inactive when said device is in said standby mode;
a clock transmission unit transmitting said intermediate clock signal;
an internal circuit receiving an internal clock signal corresponding to said intermediate clock signal from said clock transmission unit to carry out a predetermined operation, said internal circuit including
a data retain circuit receiving and retaining data according to said internal clock signal.

* * * * *